United States Patent
Martin et al.

(10) Patent No.: US 10,699,040 B2
(45) Date of Patent: Jun. 30, 2020

(54) SYSTEM AND METHOD FOR REMAINING USEFUL LIFE DETERMINATION

(71) Applicant: The Boeing Company, Chicago, IL (US)

(72) Inventors: Charles E. Martin, Thousand Oaks, CA (US); Tsai-Ching Lu, Thousand Oaks, CA (US); Samuel D. Johnson, Santa Monica, CA (US); Steve Slaughter, Scottsdale, AZ (US); Alice A. Murphy, Mesa, AZ (US); Christopher R. Wezdenko, Mesa, AZ (US)

(73) Assignee: The Boeing Company, Chicago, IL (US)

( * ) Notice: Subject to any disclaimer, the term of this patent is extended or adjusted under 35 U.S.C. 154(b) by 361 days.

(21) Appl. No.: 15/670,289

(22) Filed: Aug. 7, 2017

(65) Prior Publication Data
US 2019/0042675 A1   Feb. 7, 2019

(51) Int. Cl.
*G06F 30/20*   (2020.01)
*G06N 20/00*   (2019.01)
(Continued)

(52) U.S. Cl.
CPC ......... *G06F 30/20* (2020.01); *G05B 23/0283* (2013.01); *G06N 20/00* (2019.01);
(Continued)

(58) Field of Classification Search
None
See application file for complete search history.

(56) References Cited

U.S. PATENT DOCUMENTS

| | | | |
|---|---|---|---|
| 7,581,434 B1 * | 9/2009 | Discenzo | G01N 33/2888 73/53.01 |
| 9,558,601 B2 | 1/2017 | Lu et al. | |

(Continued)

FOREIGN PATENT DOCUMENTS

| WO | WO-2017216647 A1 * | 12/2017 | ......... G05B 23/0243 |
|---|---|---|---|

OTHER PUBLICATIONS

Jin et al. "Reliability Prognostics for Electronics via Built-in Diagnostic Tools", 2011, IEEE, 7 pages. (Year: 2011).*

(Continued)

*Primary Examiner* — Suzanne Lo
(74) *Attorney, Agent, or Firm* — Perman & Green, LLP

(57) ABSTRACT

A vehicle system prognosis apparatus including sensor(s) for detecting a characteristic of a vehicle system and generating at least one time series of condition indicator values, and a processor that receives the at least one time series and generates an analysis model, for the characteristic, that is trained with one or more of the at least one time series, that are obtained from the one or more sensors with the vehicle system operating under normal conditions, extracts from the at least one time series one or more features embodying an indication of a health of the vehicle system, generates a quantified health assessment of the vehicle system by quantifying the one or more features based on a normal distribution of the one or more features from the analysis model, and communicates the quantified health assessment of the vehicle system to an operator or crew member of the vehicle.

20 Claims, 11 Drawing Sheets

(51) Int. Cl.
    G07C 5/08    (2006.01)
    G05B 23/02   (2006.01)
(52) U.S. Cl.
    CPC ......... *G07C 5/0808* (2013.01); *G07C 5/0825* (2013.01); *G05B 23/0229* (2013.01)

(56) References Cited

U.S. PATENT DOCUMENTS

| | | | |
|---|---|---|---|
| 2014/0108314 A1 | 4/2014 | Chen et al. | |
| 2015/0006972 A1 | 1/2015 | Jones | |
| 2015/0160098 A1* | 6/2015 | Noda | G05B 23/024 702/35 |
| 2015/0269050 A1* | 9/2015 | Filimonov | G06F 11/3409 702/183 |
| 2015/0274312 A1 | 10/2015 | Conrad | |
| 2016/0091393 A1 | 3/2016 | Liao et al. | |
| 2017/0092021 A1* | 3/2017 | Nielsen | G05B 23/024 |
| 2017/0132910 A1 | 5/2017 | Chen et al. | |

OTHER PUBLICATIONS

Sandkararaman et al. "Uncertainty in Prognostics and Health Management: An Overview", 2014, European Conference of the Prognostics and Health Management Society, 11 pages. (Year: 2014).*

Goebel et al., IVHM: The Technology, Ed, Chapter 4, 2013, pp. 48-70. (Year: 2013).*

Elattar et al. "Prognostics: a literature review", 2016, Complex. Intell. Syste. 2, pp. 125-154. (Year: 2016).*

StatSoft, "Statistics Glossary C", 19 pages, Accessed at http://web.archive.org/web/20160801215047/http://www.statsoft.com/Textbook/Statistics-Glossary/C/button/c (Year: 2016).*

European Search Report, European Application No. 18187578 dated Nov. 30, 2018.

Basu, et al. "A Probabilistic Framework for Semi-Supervised Clustering". Proceedings of the Tenth ACM SIGKDD International Conference on Knowledge Discovery and Data Mining, KDD 2004, pp. 59-68.

Chandola, et al. "Anomaly Detection: A Survey". ACM Computing Surveys, vol. 41, Issue 3, Article 15, Jul. 2009, pp. 15:1-15:58.

Si, et al. "Remaining Useful Life Estimation—A Review on the Statistical Data Driven Approaches". European Journal of Operational Research, vol. 231, Issue 1, Aug. 2011, pp. 1-14.

Keogh, et al. "Finding Suprising Patterns in a Time Series Database in Linear Time and Space". Proceedings of the Eighth ACM SIGKDD International Conference on Knowledge Discovery and Data Mining, KDD 2002, pp. 550-556.

Martin, et al. "Vehicle System Prognosis Device and Method". U.S. Appl. No. 15/377,532, filed Dec. 13, 2016.

Keogh, et al. "Finding the Most Unusual Time Series Subsequence: Algorithms and Applications". Knowledge and Information Systems, vol. 11, Issue 1, Jan. 2007, pp. 1-27.

* cited by examiner

SYSTEM AND METHOD FOR REMAINING USEFUL LIFE DETERMINATION

This Invention was made with Government support under contract number W911W6-15-2-0001 awarded by the Department of Defense. The Government has certain rights in this invention.

BACKGROUND

1. Field

The aspects of the present disclosure generally relate to vehicle system monitoring and in particular, vehicle system health prognosis and remaining useful life determination.

2. Brief Description of Related Developments

Generally, there are several conventional approaches that serve to estimate a remaining useful life of a vehicle system component and detection of anomalies in data from sensors monitoring the vehicle system component. In this aspect, the detection of anomalies refers to the problem of finding patterns in data that do not conform to expected behavior. For example, statistical machine learning models generally identify anomalous or suspicious data in time series data. Regression models and other statistical analysis may also be employed to identify the anomalous or suspicious data in time series data. However, conventional machine learning models and statistical analysis generally identify isolated anomalous sequences in a stream of otherwise normal data (i.e., data obtained when the vehicle system is operating under normal conditions). Clustering analysis methods may also be used for anomaly detection in time series data. However, clustering analysis methods generally discard useful temporal information regarding the greater temporal context outside of the current point or window of time under consideration. Further, the above-mentioned analysis methods may also have a large parameter space, requiring the user to expend considerable effort to identify the correct settings for their application.

In addition to the above-mentioned analysis methods, other conventional approaches for detecting anomalous data include simple thresholding of condition indicators that are developed by domain experts.

The above analysis methods generally only provide an indication of a potential failure for a vehicle system component in terms of an early warning signal. This early warning signal is generally based on a single feature within the data being analyzed.

SUMMARY

The following is a non-exhaustive list of examples, which may or may not be claimed, of the subject matter according to the present disclosure.

One example of the subject matter according to the present disclosure relates to a vehicle system prognosis apparatus comprising: one or more sensors onboard a vehicle, the one or more sensors being configured to detect a predetermined characteristic of a vehicle system and generate at least one time series of condition indicator values corresponding to condition indicators for the predetermined characteristic; and a processor coupled to the one or more sensors so that the processor receives the at least one time series of condition indicator values, the processor being configured to generate an analysis model for the predetermined characteristic, the analysis model being trained by the processor with one or more of the at least one time series of condition indicator values, that are obtained from the one or more sensors with the vehicle system operating under normal conditions, extract from the at least one time series of condition indicator values, with the analysis model, one or more predetermined features embodying an indication of a health of the vehicle system, generate a quantified health assessment of the vehicle system by quantifying the one or more predetermined features based on a normal distribution of the one or more predetermined features from the analysis model, and communicate the quantified health assessment of the vehicle system to an operator or crew member of the vehicle.

Another example of the subject matter according to the present disclosure relates to a vehicle system prognosis apparatus comprising: one or more sensors onboard a vehicle, the one or more sensors being configured to detect a predetermined characteristic of a vehicle system and generate at least one time series of condition indicator values corresponding to condition indicators for the predetermined characteristic; a user interface; and a processor coupled to both the one or more sensors and the user interface, the processor being configured to identify anomalies within the at least one time series of condition indicator values and communicate a quantified health assessment of the vehicle system, through the user interface, at least as a visual representation of an anomaly surface corresponding to the anomalies identified within the at least one time series of condition indicator values.

Still another example of the subject matter according to the present disclosure relates to a method for vehicle system prognosis, the method comprising: detecting, with one or more sensors onboard a vehicle, a predetermined characteristic of a vehicle system and generating at least one time series of condition indicator values corresponding to condition indicators for the predetermined characteristic; and receiving the at least one time series of condition indicator values with a processor, and with the processor generating an analysis model for the predetermined characteristic, the analysis model being trained by the processor with one or more of the at least one time series of condition indicator values, corresponding to the condition indicators, that are obtained from the one or more sensors with the vehicle system operating under normal conditions; extracting from the at least one time series of condition indicator values, with the analysis model, one or more predetermined features embodying an indication of a health of the vehicle system, generating a quantified health assessment of the vehicle system by quantifying the one or more predetermined features based on a normal distribution of the one or more predetermined features, and communicating the quantified health assessment of the vehicle system to an operator or crew member of the vehicle.

BRIEF DESCRIPTION OF THE DRAWINGS

Figure 1:
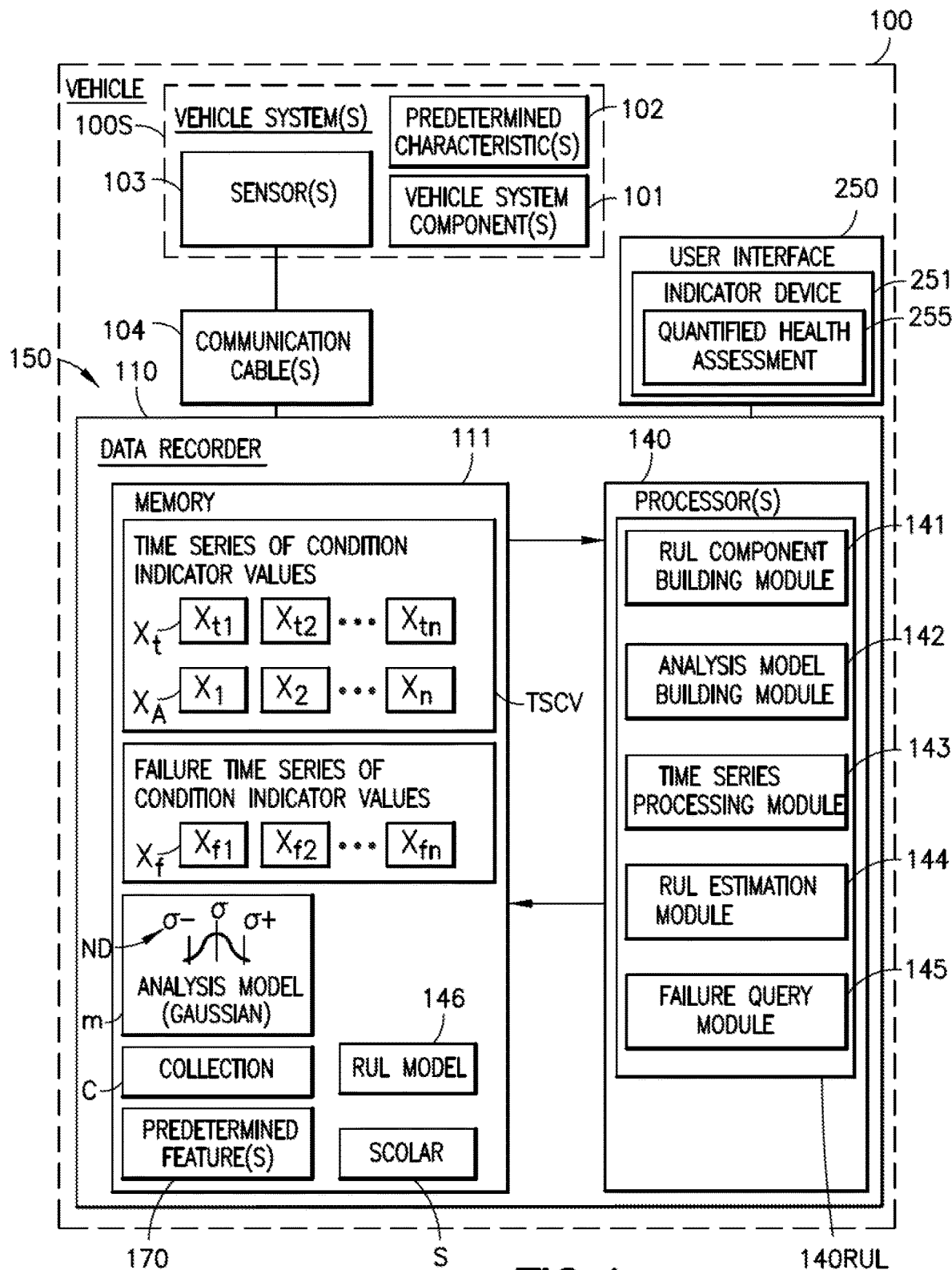
Figure 2:
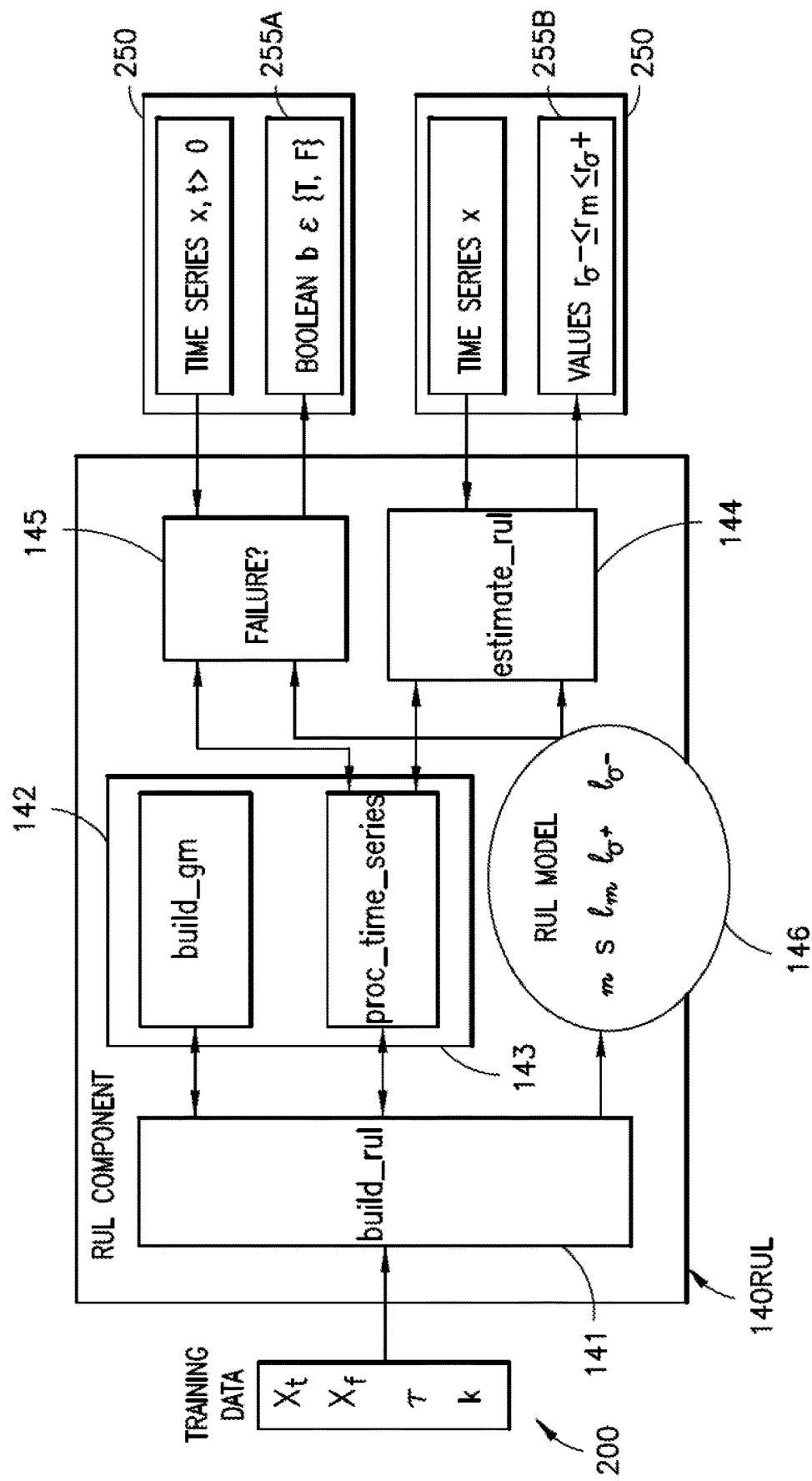
Figure 3:
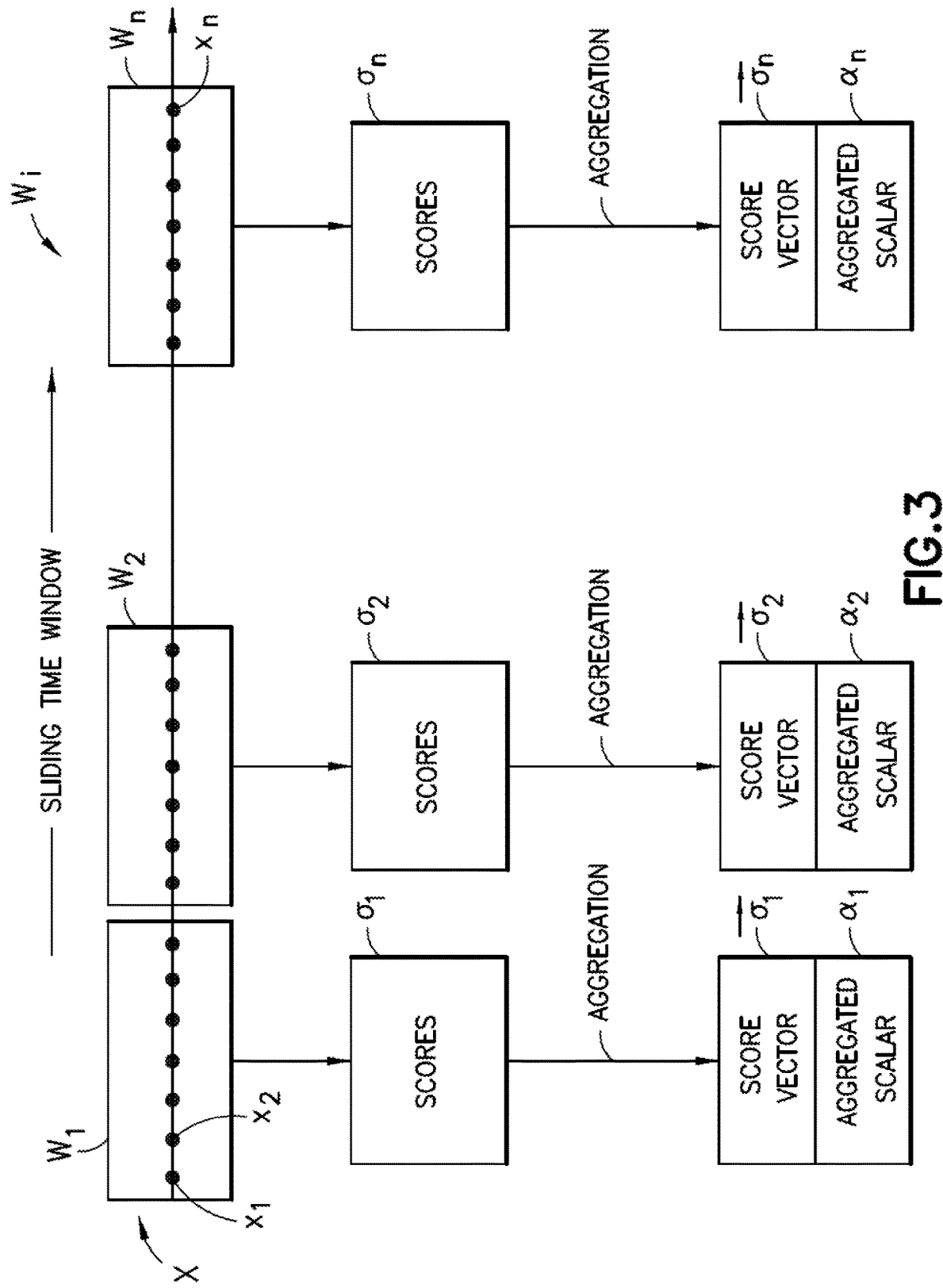
Figure 4A:
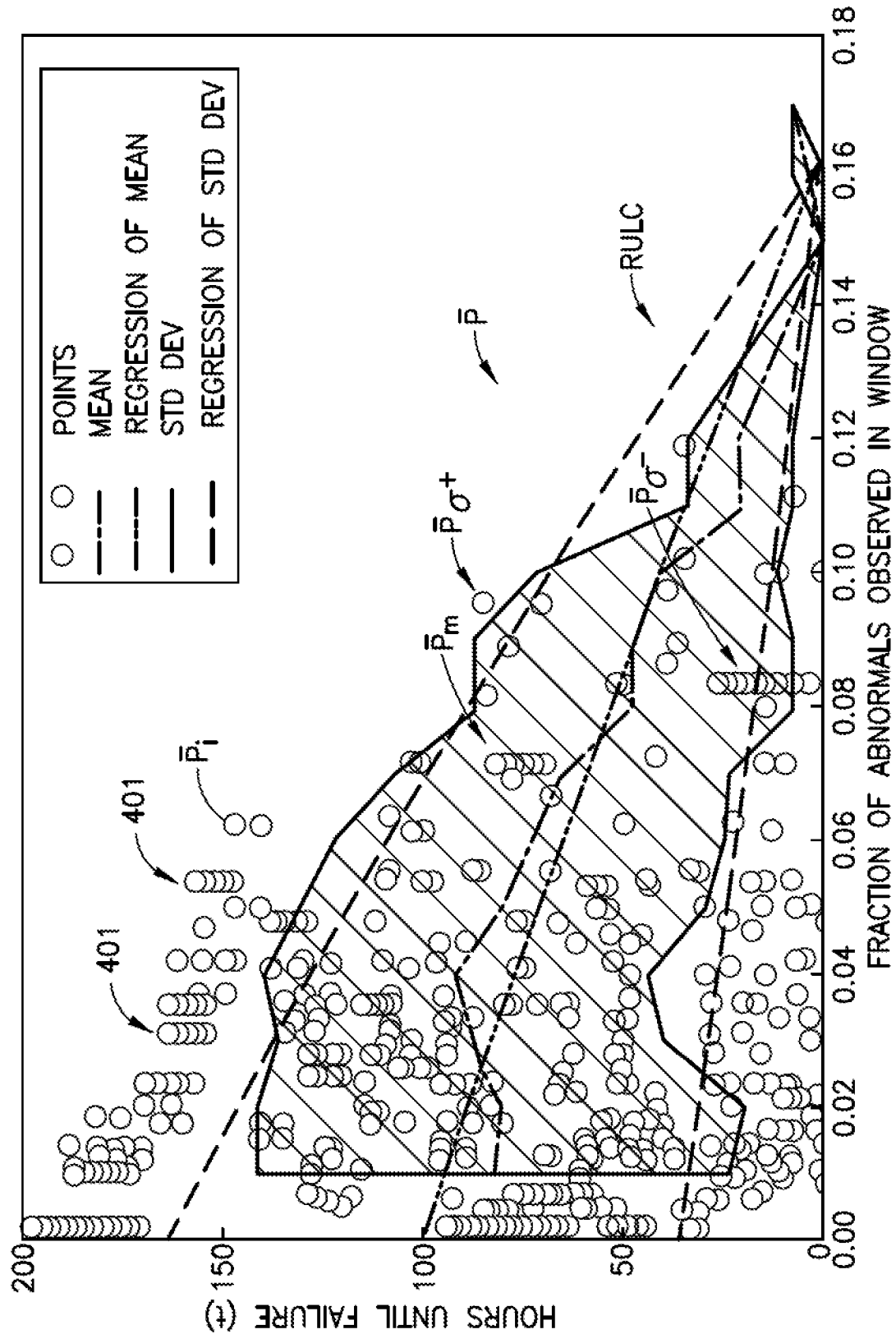
Figure 4B:
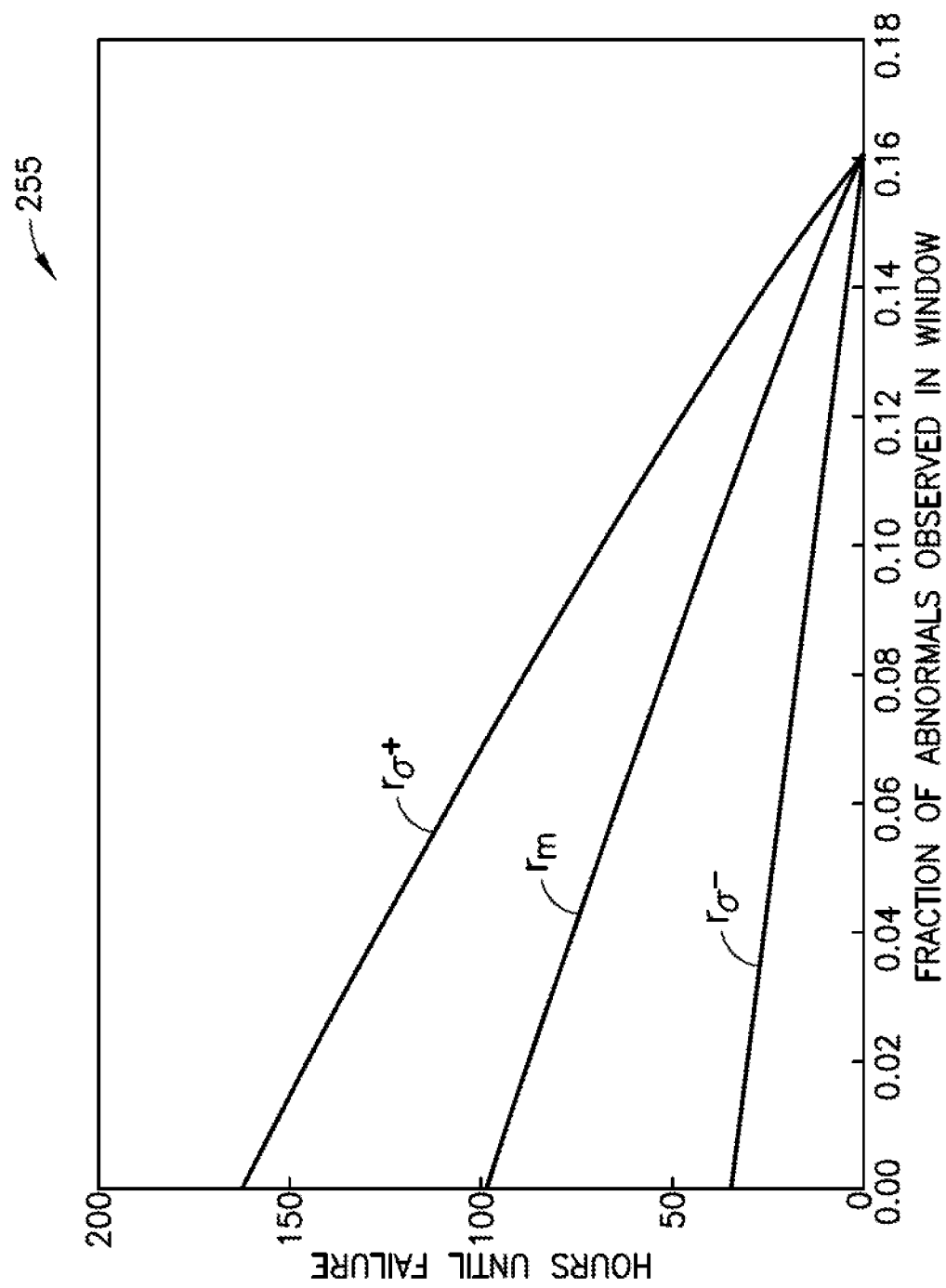
Figure 5:
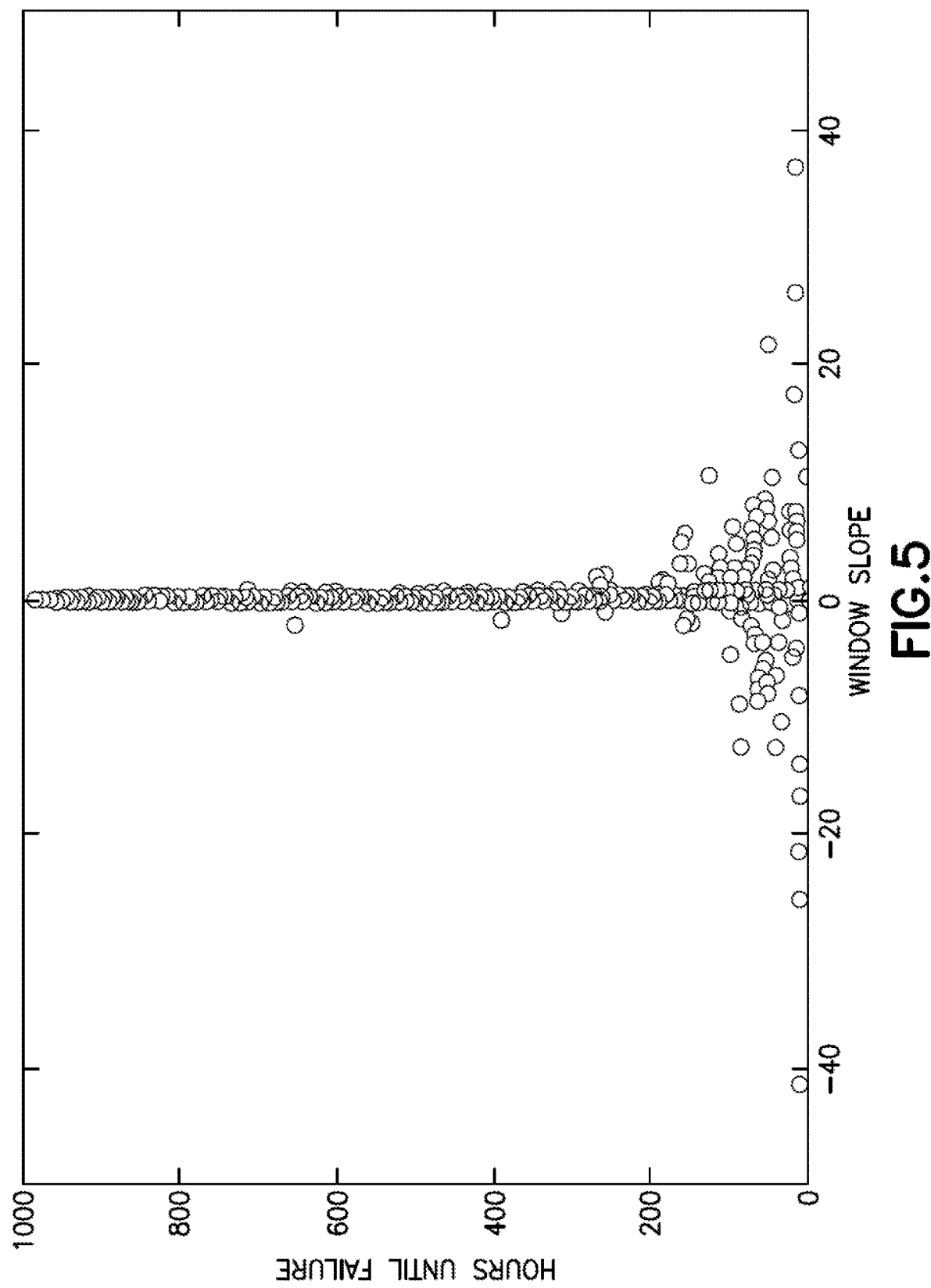
Figure 6:
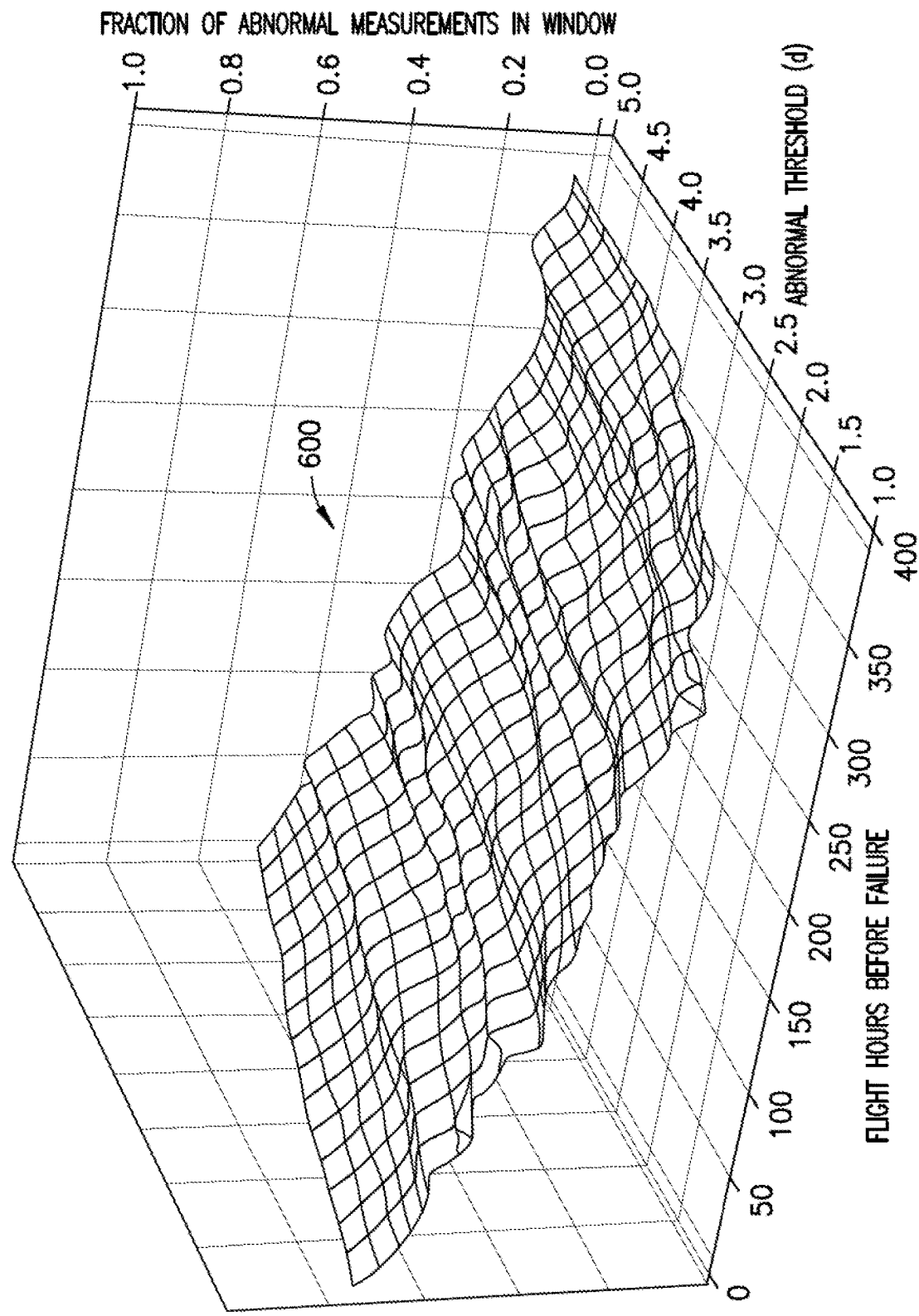
Figure 7:
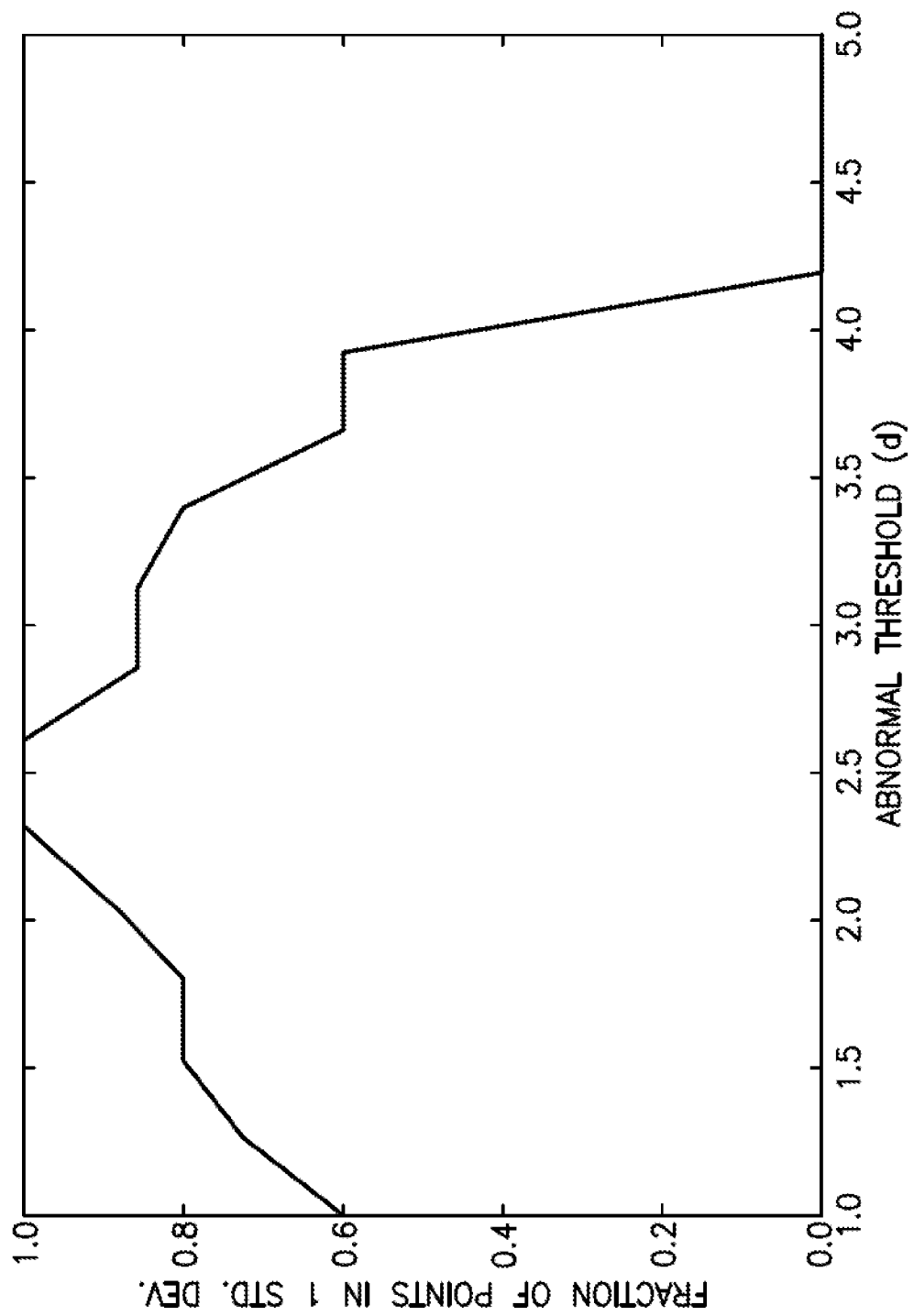
Figure 8:
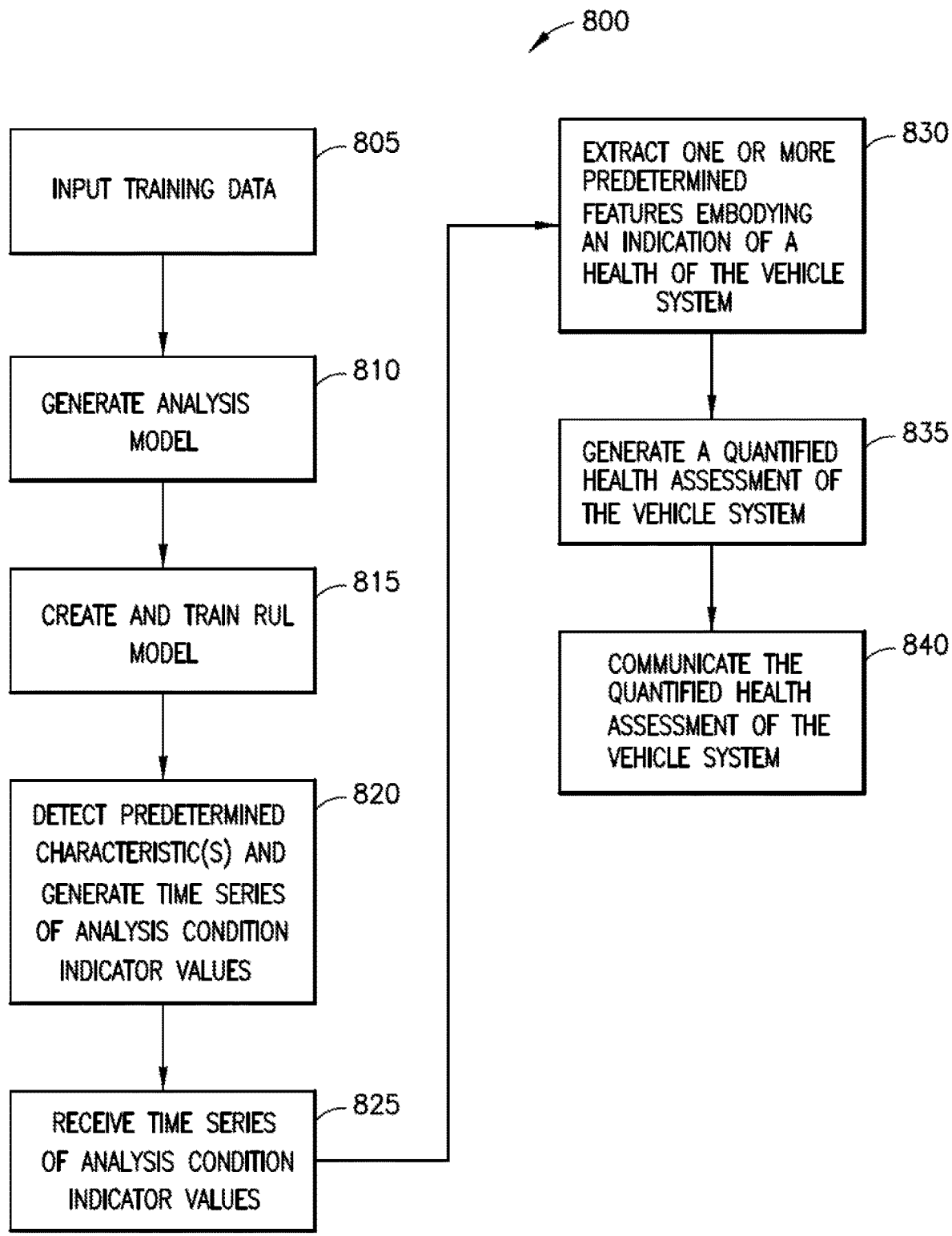
Figure 9:
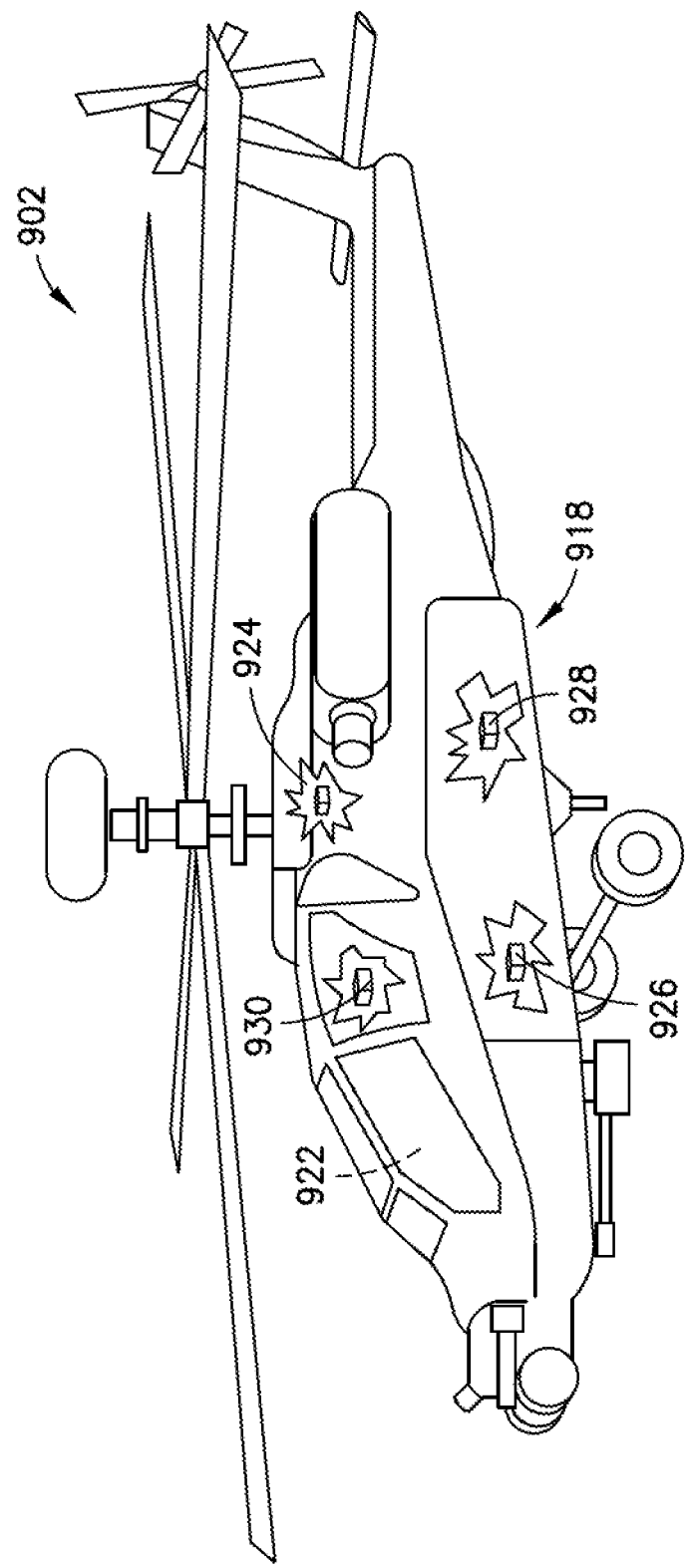
Figure 10:
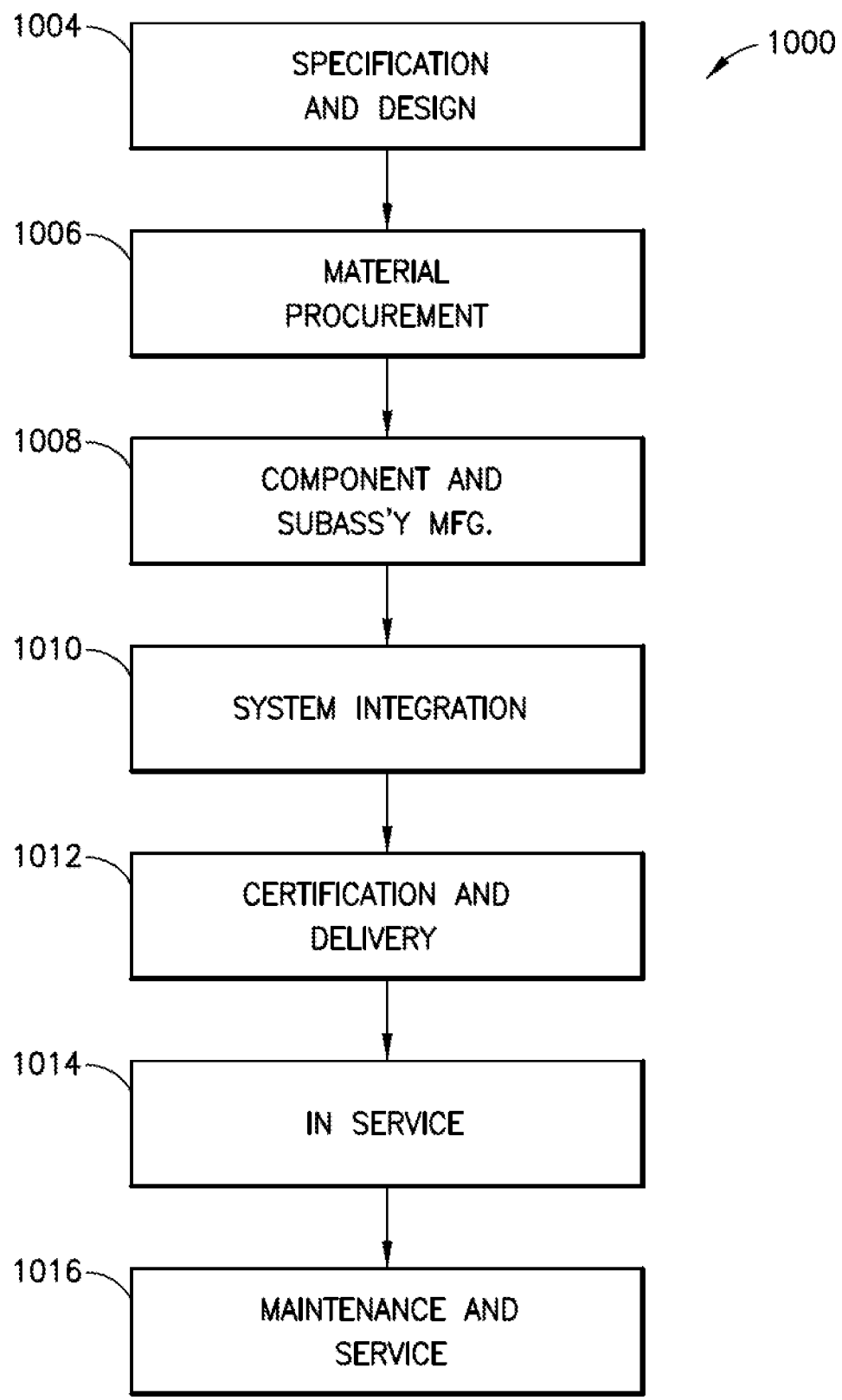

Having thus described examples of the present disclosure in general terms, reference will now be made to the accompanying drawings, which are not necessarily drawn to scale, and wherein like reference characters designate the same or similar parts throughout the several views, and wherein:

FIG. 1 is a block diagram of a vehicle system prognosis apparatus, according to aspects of the present disclosure;

FIG. 2 is a schematic flow diagram of the vehicle system prognosis apparatus of FIG. 1, according to aspects of the present disclosure;

FIG. 3 is a schematic illustration of an application of sliding time windows to times series of data, according to aspects of the present disclosure;

FIG. 4A is a graph illustrating remaining useful life curves, according to aspects of the present disclosure;

FIG. 4B is a graph illustrating remaining useful life quantified health assessment, according to aspects of the present disclosure;

FIG. 5 is a graph illustrating an aggregation of data points, according to aspects of the present disclosure;

FIG. 6 is a graph illustrating an anomaly surface, according to aspects of the present disclosure;

FIG. 7 is a graph illustrating a leave one out cross validation of the aspects of the present disclosure;

FIG. 8 is a flow diagram of a method, according to aspects of the present disclosure;

FIG. 9 is a schematic illustration of an aircraft including distributed vehicle systems; and FIG. 10 is a flow diagram of aircraft production and service methodology.

DETAILED DESCRIPTION

Referring to FIG. 1, the aspects of the present disclosure provide a vehicle system prognosis apparatus 150 and method 800 (see FIG. 8) for determining/estimating a remaining useful life and anomaly detection for a vehicle system component 101 of any suitable vehicle 100. In one aspect, the vehicle 100 may be a rotorcraft/aircraft 902 (as illustrated in FIG. 9) or any other suitable vehicle such as an aircraft, aerospace vehicle, maritime vehicle, and/or automotive vehicle. While the aspects of the present disclosure are described herein with respect to vehicle 100, it should be understood that the aspects of the present disclosure may be applied to any suitable electrical, chemical, and/or mechanical system.

Rather than identify isolated anomalous sequences in a stream of otherwise normal data (as is done by the conventional analysis methods described above), the aspects of the present disclosure identify trends of anomalous sequences in otherwise normal data (e.g., data received from vehicle system component 101 when the vehicle system component is operating under normal operating conditions). It is noted that normal operating conditions may be defined as a set of circumstances required for the proper functioning of the vehicle system component 101. The aspects of the present disclosure utilize data driven modeling, rather than simple thresholding of condition indicators (as is done in conventional fault detection systems). The aspects of the present disclosure utilize unsupervised learning (e.g., a machine learning algorithm used to draw inferences from datasets consisting of input data without labeled responses) to address a large imbalance between normal data and failure data that is common in real-world settings and is a challenge for other data-driven approaches. It is noted that the large imbalance between the normal data and the failure data is due to, for example, identifying the trends of anomalous sequences in the otherwise normal data with the vehicle system component 101 operating under normal operating conditions (e.g., most of the data received will be normal data).

The aspects of the present disclosure combine statistical modeling with time-series analysis to determine/estimate the remaining useful life even when the early warning signals (e.g., anomalous data within the otherwise normal data) of impending failure of the vehicle system component 101 are intermittent and noisy. Further, unlike conventional fault detection systems that rely on a single feature within the data being analyzed to provide early warning signals and remaining useful life estimates, the aspects of the present disclosure are compatible with a wide range of predetermined (numeric) features 170 that can be computed from a log-likelihood signal and tuned (e.g., by adjusting sliding time window sizes/lengths) to target specific vehicle system components 101. The predetermined features 170 may be one or more of a fraction of the point scores that exceed a predetermined threshold, a slope of a linear regression fitted to the point scores $\sigma$ for each sliding time window $w_i$, a variance (e.g., standard deviations) of the point scores $\sigma$ for each sliding time window $w_i$, and a mean of the point scores $\sigma$ for each sliding time window $w_i$, and other suitable statistical data as described herein.

Still referring to FIGS. 1 and 9, the vehicle system prognosis apparatus 150 extracts features from large groups of noisy variables for the purpose of enhancing the prediction of impending vehicle system component 101 failures and remaining useful life predictions within vehicle systems 100S of any suitable vehicle 100. The vehicle 100, such as rotorcraft 902, includes any suitable vehicle systems 100S having any number of vehicle system components 101. For example, the rotorcraft 902 may include one or more gear boxes (e.g., mechanical power transmission systems) 924, an environmental system 930, an electrical system 926 and a hydraulic system 928, all of which may be coupled to airframe 918 of the rotorcraft 902. The vehicle system prognosis apparatus 150 includes one or more sensors 103 disposed within or onboard the vehicle 100 and being configured to monitor one or more predetermined characteristics 102 of a respective vehicle system component 101. For example, the one or more sensors 103 measure predetermined aspects of the states of a respective vehicle system component 101. The measurements obtained by the one or more sensors 103 are used by the vehicle system prognosis apparatus 150 to infer the states and operating characteristics of the respective vehicle system component 101. In one aspect, the predetermined characteristics 102 may be condition indicators corresponding to operational characteristics (e.g., vibration, current, voltage, oil temperature, etc.) of the respective vehicle system component 101. The one or more sensors 103 onboard the vehicle 100 are configured to detect the predetermined characteristic 102 of the vehicle system component 101 and generate at least one time series of condition indicator values TSCV corresponding to condition indicators for the predetermined characteristic 102.

Referring to FIGS. 1 and 2, the vehicle system prognosis apparatus 150 also includes any suitable data recorder 110. In one aspect, the data recorder may be a maintenance data recorder, a modern signal processing unit or any other suitable data recorder of the vehicle 100. In one aspect, the data recorder 110 includes a memory 111 and a processor 140. The one or more sensors 103 are coupled to the data recorder 110 in any suitable manner, such as through communication cables 104 (or in other aspects, any suitable wireless coupling) so that sensor signals that embody one or more time series of condition indicator values TSCV is received by the data recorder 110 and stored in the memory 111 for processing by the processor 140. The processor 140 includes any suitable non-transitory computer program code for carrying out the aspects of the present disclosure. For example, the processor 140 includes a remaining useful life (RUL) component 140RUL (FIG. 2). The remaining useful life (RUL) component 140RUL includes a remaining useful life component building module 141 (illustrated and referred to in FIG. 2 as "build_rul"), an analysis model building module 142 (illustrated and referred to in FIG. 2 as "build_gm"), a time series processing module 143 (illustrated and referred to in FIG. 2 as "proc_time_series"), a remaining useful life estimation module 144 and a failure query module 145 (illustrated and referred to in FIG. 2 as "FAILURE?").

The analysis model building module 142 and the time series processing module 143 may be referred to as a Gaussian model virtual sensor GMVS. The Gaussian model virtual sensor GMVS formed by the analysis model building module 142 and the time series processing module 143 is a multivariate Gaussian model (unsupervised learning) based feature transformation that enhances vehicle system component 101 prognosis and remaining useful life prediction. It is noted that underlying causal mechanisms exist within and between the vehicle system components 101 of the vehicle systems 100S, and induce statistical dependencies among the predetermined characteristics 102. These statistical dependencies are captured and extracted by the Gaussian model virtual sensor GMVS and organized so that subtle signals that indicate shifts in the operating characteristics of the vehicle system components 101 are identified. These shifts in the operating characteristics of the vehicle system components 101 often indicate impending vehicle system component 101 failure and carry information regarding remaining useful life of the vehicle system component 101 as well.

As described herein, given a set of variables (e.g., the time series of condition indicator values TSCV) through which the states of one or more vehicle system components 101 are measured, the Gaussian model virtual sensor GMVS is trained using data corresponding to normal (e.g., non-failure) operating conditions/sensor measurements (e.g., time series of training condition indictor values $X_t$). As such, the Gaussian model virtual sensor GMVS operates without labeled failure data. As also described herein, given a multivariate time series of testing/analysis data (e.g., time series of analysis condition indicator values $X_A$), that corresponds to a sequence of measurements from a vehicle 100 for which the remaining useful life of a predetermined vehicle system component 101 is to be determined/estimated, the Gaussian model virtual sensor GMVS applies at least one variable-length sliding time window $w_1$-$w_n$ (FIG. 3) to the time series of analysis condition indicator values $X_A$. The output of the Gaussian model virtual sensor GMVS, corresponding to each variable length sliding time window $w_1$-$w_n$, for each analysis time series $x_1, x_2, \ldots, x_n$ in the time series of analysis condition indicator values $X_A$ is aggregated into a one-dimensional signal. The processor 140 is configured to analyze first-order behavior of the aggregated signals as the sliding time window $w_1$-$w_n$ (FIG. 3) moves over the analysis time series $x_1, x_2, \ldots, x_n$ so that the vehicle system prognosis apparatus 150 determines/estimates the remaining useful life of the vehicle system component 101. Here the vehicle system prognosis apparatus 150 determines/estimates the remaining useful life of the vehicle system component 101 by building on the fault detection capabilities provided by the Gaussian model virtual sensor GMVS.

Still referring to FIGS. 1 and 2, the Gaussian model virtual sensor GMVS includes an analysis model m, which in one aspect is a Gaussian model created by the analysis model building module 142. In other aspects any suitable statistical model may be used, such as a Gaussian mixture model. The analysis model m may be stored in memory 111 so that the analysis model m is accessible by the processor 140. The analysis model m provides pre-processing on multivariate data points (e.g., on the time series of analysis condition indicator values $X_A$). The analysis model m is configured to learn characteristics of multivariate data points conveying a state of the vehicle system component(s) 101 under normal operating conditions (e.g., when a failure is not imminent). The processor 140 is configured to generate the analysis model m for a predetermined characteristic 102 of the vehicle system component 101, where the analysis model m is trained by the processor 140 with one or more of at least one time series of training condition indicator values $X_t$, that are obtained from one or more sensors 103 with the vehicle system 100S operating under normal conditions. For example, the analysis model m is created by the analysis model building module 142, so that the analysis model m fits the normal data and provides for the scoring of future data (e.g., the time series of analysis condition indicator values $X_A$) against the analysis model m. An exemplary pseudocode implementation for the creation of the analysis model m is illustrated in Algorithm 1.

---

Algorithm 1: Procedure for building a model characterizing
data that represents "normal" behavior Function: build_gm($X_t$)
Input: $X_t = \{x_{t1}, \ldots, x_{tm}\}$ is a set of training measurements.
  1:      m, s $\Leftarrow$ pca($X_t$) {Build the Gaussian model using PCA.}
  2:      return m, s {Return the model m and scaler s.}

---

Here the time series of training condition indictor values $X_t$ (including the set of training measurements/condition indicator values $\chi_{t1}, \ldots, \chi_{tm}$) is received in the analysis model building module 142. As noted herein, the time series of training condition indictor values $X_t$ include data (e.g., normal data) obtained from the vehicle system component 101 operating under normal operating conditions. The analysis model building module 142 is configured to create the analysis model m using, for example, principle component analysis (PCA) or any other suitable probabilistic analysis. As a result of the principle component analysis, the analysis model m and a scalar s is returned and stored in, for example, memory 111. The scalar s is, for example, the mean and standard deviation(s) of a log-likelihood signal from the analysis model m based on the normal data. The scalar s may be used to determine whether future data (e.g., time series of analysis condition indicator values $X_A$) is anomalous (e.g., one or more predetermined features extracted from the future data is quantified based on a normal distribution ND of the analysis model m). For example, the log-likelihoods for the analysis time series $x_1$-$x_n$ in the time series of analysis condition indicator values $X_A$ may be compared with the scalar s to determine how normal or abnormal the data points within the analysis time series $x_1$-$x_n$ are.

Referring to FIGS. 1, 2 and 3, the time series processing module 143 generates enhanced features, from the preprocessed multivariate data points, by applying the analysis model m to the sliding time window $w_1$-$w_n$ (FIG. 3) over a times series of the pre-processed multivariate data points. For example, given a time series of data points $x=(\chi_1, \chi_2, \ldots, \chi_n)$, where x is one of the analysis time series $x_1$-$x_n$ in the time series of analysis condition indicator values $X_A$, the time series processing module 143 applies the analysis model m to the time series of data points x using a windowing and aggregation schema. For example, as can be seen in FIG. 3, the time series processing module 143 assigns the time series of data points x to sliding time windows $w_1, w_2, \ldots, w_n$ so that an arbitrary time window $w_i=(\chi_j, \chi_{j+1}, \ldots, \chi_{j+k'-1})$ includes a sequence of at most k consecutive points from the time series of data points x (e.g., k defines the maximum size/length of the sliding time window $w_i$). For each sliding time window $w_i$, at least one data point within the sliding time window $w_i$ is scored (e.g., to generate scores $\sigma_1$-$\sigma_n$ corresponding to each window $w_1$-$w_n$) using the analysis model m created using Algorithm 1. For example the analysis model m generates a log likelihood for the time series of data points x and the time series processing module 143 compares the log likelihood for the time series of data points x in each sliding time window $w_i$ with the scalar s to generate the scores $\sigma_1$-$\sigma_n$ for the respective window $w_i$. Here let $\sigma_i=(\sigma_{i,1}, \ldots, \sigma_{i,k})$ denote the scores for the points in sliding time window $w_i$, where i=the sliding time window number and 1-k (in i,1-i,k) represents the data point within the sliding time window $w_i$. The time series processing module 143 is configured to aggregate the scores $\sigma_i$ for each sliding time window $w_i$, using any suitable aggregation method, into a respective single aggregate value $\alpha_i$.

In one aspect, the time series processing module 143 is configured to aggregate the scores $\sigma_i$ for each sliding time window $w_i$ by determining one or more of a fraction of (point) scores $\sigma_{ij}$ that are greater than a given threshold (see FIG. 4A, e.g., a fraction of abnormal points), a slope of a linear regression fitted to the (point) scores $\sigma_i$ (see FIG. 5, where a linear regression is performed on each sliding time window and the slope is returned as an aggregate value), a variance of the (point) scores $\sigma_i$, and a mean of the of the points/scores $\sigma_i$. For exemplary purposes, FIG. 4A illustrates a procedure for building remaining useful life curves RULC (as described herein with respect to Algorithm 3) using the fraction of abnormal points/scores $\sigma_i$ within a sliding time window $w_i$ where each (point) score $\sigma_i$ in FIG. 4A corresponds to an individual respective sliding time window $w_i$, and the regression lines are shown for a two-degree polynomial curve fit. Also, for exemplary purposes, FIG. 5 illustrates an indication of remaining useful life using an aggregate method that performs linear regression on the (point) scores $\sigma_i$ of each of the sliding time windows $w_i$, and returns the slope as the aggregate value $\alpha_i$.

The time series processing module 143 provides a transformation of the time series of data points x into an ordered set of windows w, a score vector $\vec{\sigma}$ (see $\vec{\sigma}_1$-$\vec{\sigma}_n$ in FIG. 3) for each sliding time window $w_i$, and an aggregated scalar $\vec{\alpha}$ (see $\alpha_1$-$\alpha_n$ in FIG. 3) for each sliding time window $w_i$. A pseudocode description of the time series processing module 143 is listed in Algorithm 2.

Referring to FIGS. 1 and 2, and Algorithm 3 (below), the analysis model building module 142 and the time series processing module 143 of the Gaussian model virtual sensor GMVS are illustrated as being integrated with the remaining useful life component 140RUL. Here training data 200 is input (FIG. 8, Block 805) to the remaining useful life component building module 141. The training data 200 includes, for example, the time series of training condition indicator values $X_t$, a time series of failure condition indicator values $X_f$, a function $\tau$ that, given a data measurement $\chi \in x_i$, $\tau(\chi)$ is the number of hours before the failure in case study $x_i$, and the maximum length k of the sliding time window $w_i$.

The remaining useful life component building module 141 uses the analysis model building module 142 to generate the analysis model m (FIG. 8, Block 810), as described above (see also line 1 of Algorithm 3), using the time series of training condition indicator values $X_t$.

As can be seen in FIG. 2, the RUL component 140RUL generates and trains a RUL model 146 (FIG. 8, Block 815), which may be stored in the memory 111. To generate and train the RUL model 146 a collection of failure case studies (e.g., time series of failure condition indicator values $X_f$) is provided to the RUL component building module 141, where each $x_{fi}$ in the time series of failure condition indicator values $X_f$ is a time series of measurements that record a series of measurements preceding an imminent failure. For example, at least one time series of failure condition indicator values $X_f$, corresponding to the condition indicators, is obtained from the one or more sensors 103 (FIG. 1) with the vehicle system 100S (FIG. 1) operating only under abnormal conditions. It is noted that the convention used herein for each time series of measurements $x_{fi}$ assumes that the time series are oriented such that failure occurs "before" the first point and the subsequent points represent instances further and further into the past.

Predetermined failure features are extracted, from the at least one time series of failure condition indicator values $X_f$, by applying a sliding time window $w_i$ of a predetermined size to the at least one time series of failure condition indicator values $X_f$, where each failure data point of the at least one time series of failure condition indicator values $X_f$ within the sliding time window $w_i$ is scored with the analysis model m to produce a (failure point) score $\sigma$ for one or more failure data points within the sliding time window $w_i$. For example, for each or at least one time series of measurements $x_{fi}$, the RUL component building module 141 calls the feature extraction of Algorithm 2 (see line 4 of Algorithm 3), to obtain a windowed version of the time series of failure condition indicator values $X_f$ (e.g., the windowed version

---

Algorithm 2: Procedure for building the temporal profile for a single time series (where time series may also be referred to as a case study)

---

Function: proc_time_series (x, m, s, k)
Input: $x = (x_1, \ldots, x_T)$ is a time series of measurements.
Input: m and s to be the model and scaler returned by Algorithm 1.
Input: $k \geq 1$ is the maximum length of the sliding window.
   1:   $w = (w_1, \ldots, w_{T'}) \Leftarrow$ get_windows(x, k) {Creates windows of x, with $w_j = (x_j, x_{j+1}, \ldots, x_{j+k'-1})$ for $k' \leq k$.}
   2:   for all i = 1, ..., T' do
   3:     $k' \Leftarrow |w_i|$
   4:     $\sigma_i = (\sigma_{i,1}, \ldots, \sigma_{i,k'}) \Leftarrow$ score_window(m, s, $w_i$) {Score each point in the window.}
   5:     $\alpha_i \Leftarrow$ aggregate($\sigma_i$) {Aggregate the window's scores into a single value.}
   6:   end for
   7:   return $w = (w_1, \ldots, w_{T'})$, $\vec{\sigma} = (\sigma_1, \ldots, \sigma_{T'})$, $\vec{\alpha} = (\alpha_1, \ldots, \alpha_{T'})$ being $w_i=(w_1, \ldots, w_{T'})$), a vector of scores $\vec{\sigma}_i=(\sigma_1, \ldots, \sigma_{T'})$ whose $i^{th}$ entry includes a vector of scores for the $i^{th}$ window in $w_i$ (see line 4 of Algorithm 2), and another vector $\vec{\alpha}_i=(\alpha_1, \ldots, \alpha_{T'})$ whose $i^{th}$ entry includes an aggregate score for the $i^{th}$ window in $w_i$ (see line 5 in Algorithm 2). A tuple including $w_i$, $\vec{\sigma}_i$, $\vec{\alpha}_i$ is created for each time series $x_{fi} \in X_f$, where the tuple $w_i$, $\vec{\sigma}_i$, $\vec{\alpha}_i$ is stored in a collection C in the memory 111 (see lines 2-6 of Algorithm 3).

In addition, referring also to FIG. 4A, to generate the RUL model 146, the information stored in collection C (e.g., a tuple including $w_i$, $\vec{\sigma}_i$, $\vec{\alpha}_i$ for each time series $x_{fi} \in X_f$) is used by the RUL component building module 141 to estimate a remaining useful life curve RULC (see FIG. 4A). For example, the RUL component building module 141 generates a collection of two-dimensional points P that correspond to abnormal data points in the normal distribution ND of the one or more predetermined features 170. Each of the two-dimensional points represents an aggregated score σ for a corresponding sliding time window $w_i$ versus an amount of time prior to failure that the corresponding sliding time window $w_i$ appeared. Here, the RUL component building module 141 builds the collection of two-dimensional points for each, or at least one, window of every, or at least one, time series of measurements $x_{fi}$ with the first component (e.g., the horizontal axis in FIG. 4A) measuring the aggregated score $\vec{\alpha}_i$ (in the form of a fraction of abnormal points observed in the respective window $w_i$) for a window $w_i$ and the second component (e.g., the vertical axis in FIG. 4A) represents an amount of time prior to a failure that the window $w_i$ appeared. The time associated with a given window $w_i=(w_{i1}, w_{i2}, \ldots, w_{ik})$ (from the application of the sliding time windows $w_1$-$w_n$ described above) is resolved using any suitable auxiliary information regarding the first point $w_{i1}$ in the given sliding time window $w_i$. As such, let $t_i=\tau(w_{i1})$ denote the time associated with the sliding time window $w_i$. The resulting point $p_i$ for the remaining useful life curve RULC (illustrated in FIG. 4A) is then $p_i=(\alpha_i, t_i)$. The set of all points, e.g., corresponding to all windows in every time series $x_{fi} \in X_f$ is denoted by P. The process for creating the points P is shown in lines 7-13 of Algorithm 3.

The RUL component building module 141 uses the points P for the purpose of fitting curves (e.g., the remaining useful life curve RULC) to all of the two-dimensional points for all of the at least one time series of failure condition indicator values $X_f$, where the curves define functions that correspond to the mean, the mean plus a predetermined number of standard deviations and the mean minus the predetermined number of standard deviations of the two-dimensional points for all of the at least one time series of failure condition indicator values $X_f$. However, rather than using the points P themselves for fitting the remaining useful life curve RULC, a simple discretization of the aggregated scores $\alpha_i$ is performed by the RUL component building module 141 to produce bins 401 of points $\bar{p}_i$ (e.g., points arranged along a common vertical axis in FIG. 4A), where $\bar{P}$ is the resulting set of discretized points $\bar{p}_i$ and $\bar{\alpha}_i$ is a discretized value of a respective aggregated scores $\alpha_i$. Then any suitable statistical measurement effecting the computation of a probability distribution for each bin 401 is performed for fitting the remaining useful life curve RULC to the points $\bar{P}$. In other aspects, the points P may be used for fitting the remaining useful life curve RULC.

For each unique value of the discretized aggregated scores $\bar{\alpha}_i$ in the points $\bar{P}$, three new points are created that correspond to the mean and ±a predetermined number of standard deviations of the distribution of $t_i$ values that correspond to the discretized aggregated scores $\bar{\alpha}_i$ in the points $\bar{P}$. Let $\bar{P}_m$, $\bar{P}_{\sigma+}$, $\bar{P}_{\sigma-}$ denote the resulting set of points, where $\bar{P}_m$ is the resulting set of points corresponding to the mean, $\bar{P}_{\sigma+}$ is the resulting set of points corresponding to plus the predetermined number of standard deviations, $\bar{P}_{\sigma-}$ is the resulting set of points corresponding to minus the predetermined number of standard deviations (see lines 14-22 of Algorithm 3). The RUL model 146 is completed by fitting curves to each of the sets $\bar{P}_m$, $\bar{P}_{\sigma+}$, $\bar{P}_{\sigma-}$ of points, where the result is a set of functions $l_m$ (derived from the mean fitted curve), $l_{\sigma+}$ (derived from the plus standard deviation fitted curve), and $l_{\sigma-}$ (derived from the minus standard deviation fitted curve) used by the RUL component 140RUL for making remaining useful life estimations (see Algorithm 4 below) and answering remaining useful life queries (see Algorithm 5 below).

As can be seen above, when the RUL model 146 is created/completed, there exists instances of the analysis model m, the scalar s and functions $l_m$, $l_{\sigma+}$, $l_{\sigma-}$ so that the RUL component 140RUL is initialized and ready to answer queries and make remaining useful life estimates for new (e.g., previously unseen/unrecorded) time series of measurement data (e.g., the time series of analysis condition indicator values $X_A$). For example, the functions $l_m$, $l_{\sigma+}$, $l_{\sigma-}$, defined by the fitted curves, are applied to the one or more predetermined features 170 to generate the quantified health assessment 255A, 255B of the vehicle system 100S and/or vehicle system component 101. A pseudocode description of the RUL component building module 141 is listed in Algorithm 3.

---

Algorithm 3: Procedure for building the RUL curves

Function: build_rul($X_t$, $X_f$, τ, k)
Input: $X_t$ = { $x_1$, ... , $x_n$ } is a set of training measurements.
Input: $X_f$ = {$x_1$, ... , $x_{n'}$} is a collection of time series $x_i$ for failure case studies.
Input: τ is a function that, given a data measurement $x \in x_i$, τ(x), is the number of hours before the failure in case study $x_i$.
Input: k ≥ 1 is the maximum length of the sliding window.
    1:      m, s ⇐ build_gm($X_t$)
    2:      C = 0
    3:      for all $x_i \in X_f$ do
    4:      $w_i$, $\vec{\sigma}_i$, $\alpha_i$ ⇐ proc_time_series($x_i$, m, s, k)
    5:      C ⇐ C ∪ {<$w_i$, $\vec{\sigma}_i$, $\alpha_i$>}
    6:      end for
    7:      P ⇐ 0
    8:      for all $c_j$ = <$w_i$, $\vec{\sigma}_i$, $\alpha_i$> ∈ C do
    9:      $x_i$ ⇐ $w_i$ {$x_i$ is the point in window $w_i$ closest to the failure}
    10:     $t_i$ ⇐ τ($x_i$)
    11:     $p_i$ ⇐ ($\alpha_i$, $t_i$)

```
Algorithm 3: Procedure for building the RUL curves

12:         P⇐P ∪ {p_i}
13:       end for
14:       P̄⇐discretize(P) {Discretize the first coordinate of each point in P.}
15:       P̄_m⇐0, P̄_σ+⇐0, P̄_σ-⇐0
16:       for all distinct ᾱ ∈ P̄ do
17:         T⇐{t_j | ᾱ_j = ᾱ_i, (ᾱ_j, t_j) ∈ P̄}
18:         t_m⇐mean(T)
19:         d⇐std(T)
20:         t_σ+⇐t_m + d, t_σ-⇐t_m - d
21:         P̄_m⇐P̄_m ∪ {(ᾱ, t_m)}, P̄_σ+⇐P̄_σ+ ∪ {(ᾱ, t_σ+)}, P̄_σ-⇐P̄_σ- ∪ {(ᾱ, t_σ-)}
22:       end for
23:       l_m⇐fit(P̄_m), l_σ+⇐fit(P̄_σ+), l_σ-⇐fit(P_σ-) {Fit mean and ± standard deviation lines}
24:       return m, s, l_m, l_σ+, l_σ-
```

In one aspect, referring to FIGS. 1, 2 and 4B (and algorithm 4), the vehicle system prognosis apparatus 150 is used to estimate a remaining useful life of the vehicle system 100S and/or vehicle system component 101, noting that the remaining useful life of the vehicle system 100S as a whole may be dependent upon the remaining useful life of its individual vehicle system components 101. The analysis model m and the RUL model 146 are generated and trained in the manner described above so as to initialize the remaining useful life component 140RUL. The one or more sensors 103 onboard the vehicle 100 detect a predetermined characteristic 102 of respective vehicle system 100S (e.g., a predetermined characteristic 102 of a vehicle system component 101 of the vehicle system 100S) and generates at least one time series of analysis condition indicator values $X_A$ corresponding to condition indicators for the predetermined characteristic 102 (FIG. 8, Block 820). The at least one time series of analysis condition indicator values $X_A$ is stored in the memory 111 and is received by the processor 140 from the memory 111 (FIG. 8, Block 825). The RUL estimation module 144 of the remaining useful life component 140RUL receives as inputs the analysis model m, the scalar s, and the functions $l_m$, $l_{σ+}$, $l_{σ-}$. The RUL estimation module 144 also receives as inputs at least one window $w=(χ_1, χ_2, \ldots, χ_k)$, having any suitable length, of time series measurements corresponding to the at least one time series of analysis condition indicator values $X_A$ as determined above with respect to Algorithm 2.

In a manner similar to that described above, the data points within the window w are processed by the analysis model m, e.g. one or more predetermined features embodying an indication of a health of the vehicle system 100S are extracted (FIG. 8, Block 830), applied to the scalar s and are scored, where the score $σ=(σ_1, \ldots, σ_k)$. In a manner also similar to that described above, the scores σ are aggregated into an aggregate value α. This aggregate value α is applied to the functions $l_m$, $l_{σ+}$, $l_{σ-}$ to generate a quantified health assessment 255B of the vehicle system 100S (or a vehicle system component 101) (FIG. 8, Block 835) by returning curves $r_m$, $r_{σ+}$, $r_{σ-}$, where $r_m$ is a curve representing a mean remaining useful life, $r_σ$ is a curve representing a plus (any suitable number of) standard deviations of the remaining useful life, and $r_{σ-}$ is a curve representing minus (any suitable number of) standard deviations of the remaining useful life. The quantified health assessment 255B of the vehicle system 100S (or vehicle system component 101) is communicated to an operator or crew member of the vehicle 100 (FIG. 8, Block 840). In one aspect, the graph illustrated in FIG. 4B is presented through any suitable indicator device 251 of a user interface 250 of the vehicle 100. A pseudocode description for determining the remaining useful life of the vehicle system 100S and/or the vehicle system component 101 is listed in Algorithm 4.

```
Algorithm 4: Procedure for estimating RUL given a window of measurements

Function: estimate_rul(m, s, l_m, l_σ+, l_σ-, w)
Input: m, s, l_m, l_σ+, l_σ- are the models and RUL curves returned by Algorithm 3.
Input: w = (x_1, ... , x_k) is a short window of time series of measurements.
         {Score the window and aggregate the scores.}
1:       σ = (σ_1, ... , σ_k)⇐score_window(m, s, w)
2:       α⇐aggregate(σ)
         {Get RUL predictions.}
3:       r_m⇐l_m(α)
4:       r_σ+⇐l_σ+(α)
5:       r_σ-⇐l_σ-(α)
6:       return r_m, r_σ+, r_σ-
```

As can be seen from the graph of FIG. 4B, the vehicle system prognosis apparatus 150 produces as an output a numeric estimate (e.g., number of hours remaining until failure) of the remaining useful life of the vehicle system 100S and/or vehicle system component 101. For example, the (remaining useful life) curves $r_m$, $r_{σ+}$, $r_{σ-}$ illustrate, numerically, a number of hours until failure (e.g., curve $r_m$) with confidence bounds (e.g., curves $r_{σ+}$, $r_{σ-}$) to provide reliable estimates of remaining useful life. In addition, providing a visualization of the quantified health assessment 255B (e.g., in this aspect, as the graph of FIG. 4B) allows the user or crew member of the vehicle 100 to identify trends that are indicative of impending failure.

While the quantified health assessment 255B is described above as a graph illustrating (remaining useful life) curves $r_m$, $r_{σ+}$, $r_{σ-}$, in another aspect referring to FIGS. 3 and 6, the quantified health assessment 255B may be represented on the indicator device 251 (FIG. 1) as a visualization of an anomaly surface 600 defined by a time before failure, an abnormality of the one or more predetermined features and the one or more predetermined features (see FIG. 6), where an anomaly is, e.g., the presence of abnormal data among the data received during normal operation as determined by the normal distribution ND of the analysis model m. Here, the Gaussian model virtual sensor GMVS is able to clearly show a signal as an impending failure approaches. The anomaly surface 600 illustrated in FIG. 6 is generated by compiling output signals from the Gaussian model virtual sensor GMVS for any suitable number of time series of analysis condition indicator values $X_A$. In these time series of analysis condition indicator values $X_A$ the aggregate method used as a subroutine in Algorithm 2 returns the fraction of points in a sliding time window $w_i$ that are over a predetermined threshold (e.g., what is referred to as abnormal threshold d). Here, the abnormal threshold d is a predetermined number of standard deviations from the mean of the data points in the sliding time window $w_i$. For example, the abnormal threshold axis in FIG. 6 shows an exemplary range of values for the abnormal threshold d, however the abnormal threshold axis may have any suitable range of values, such as for example, a range where the abnormal threshold d set to a range between two and three standard deviations (e.g., $2 \leq d \leq 3$). In addition to the abnormal threshold d, the anomaly surface 600 is plotted against two other axes (e.g., the anomaly surface is three-dimensional) which include a number of hours before failure and the fraction of abnormal measurements in the window $w_i$. As such, the "anomaly" in the anomaly surface 600 is the number of data points are beyond a predetermined number of standard deviations from the mean of the data points in the window $w_i$. As can be seen in FIG. 6 as an impending failure approaches the fraction of abnormal measurements in the window $w_i$ increases showing a trend of impending failure.

Referring again to FIGS. 1 and 2, in one aspect the vehicle system prognosis apparatus 150 is configured to provide (in addition to or in lieu of the graphs of FIGS. 4B and 6 described above) the quantified health assessment 255A on the indicator device 251 as a Boolean response to a query as to whether a failure will occur within a prescribed time period. For example, here the failure query module 145 receives as inputs the analysis model m, the scalar s and the functions $l_m$, $l_{\sigma+}$, $l_{\sigma-}$. The failure query module 145 also receives as inputs a query time $t_q$ and at least one window $w=(\chi_1, \chi_2, \ldots, \chi_k)$, having any suitable length, of time series measurements (FIG. 8, Block 825) corresponding to the at least one time series of analysis condition indicator values $X_A$ as determined above with respect to Algorithm 2.

In a manner similar to that described above, the data points within the window w are processed by the analysis model m, e.g. one or more predetermined features embodying an indication of a health of the vehicle system 100S are extracted (FIG. 8, Block 830), applied to the scalar s and are scored, where the score $\sigma=(\sigma_1, \ldots, \sigma_k)$. In a manner also similar to that described above, the scores σ are aggregated into an aggregate value α. This aggregate value α is applied to the functions $l_m$, $l_{\sigma+}$, $l_{\sigma-}$ and tested against the query time $t_q$ (see line 3 of Algorithm 5) to generate the quantified health assessment 255A of the vehicle system 100S (or a vehicle system component 101) (FIG. 8, Block 835). Here if the query time $t_q$ is determined to be greater than $l_{\sigma-}(\alpha)$ but less than $l_{\sigma+}(\alpha)$, then an indication (e.g., a "true" indication) is provided on the indicator device 251 (FIG. 8, Block 840) that a failure will occur within the query time $t_q$. If the condition $l_{\sigma-}(\alpha) \leq t_q \leq l_{\sigma+}(\alpha)$ is not satisfied, then an indication (e.g., a "false" indication) is provided on the indicator device 251 (FIG. 8, Block 840) that a failure will not occur within the query time $t_q$.

---

Algorithm 5: Procedure for deciding whether a window of measurements w is indicative of an impending failure in t hours

---

Function: failure?(m, s, $l_m$, $l_{\sigma+}$, $l_{\sigma-}$, w, $t_q$)
Input: m, s, $l_m$, $l_{\sigma+}$, $l_{\sigma-}$, are the models and RUL curves returned by Algorithm 3.
Input: w = ($x_1$, ... , $x_k$) is a short window of time series of measurements.
Input: $t_q > 0$ is the query time.
    1:        $\sigma = (\sigma_1, \ldots, \sigma_k) \Leftarrow$ score_window(m, s, w)
    2:        $\alpha \Leftarrow$ aggregate($\sigma$)
                {Test aggregated value α and time $t_q$ with respect to RUL curves.}
    3:        if $l_{\sigma-}(\alpha) \leq t_q \leq l_{\sigma+}(\alpha)$ then
    4:            return true
    5:        else
    6:            return false
    7:        end if

---

In one aspect, as described above, the predetermined (numeric) features 170 (e.g., fraction of points, linear regression, mean, standard deviations, and other suitable statistical data as described herein) can be tuned by adjusting sliding time window sizes/lengths k to target specific vehicle system components 101. For example, the maximum size/length k of the sliding time window $w_i$ (see FIG. 3) may be adjusted (increase k) to reduce volatility of the output of the time series processing module 143 or adjusted (decrease k) to increase volatility of the output of the time series processing module 143 depending on, for example, a type of vehicle system component 101, a quality of data measurements received from the sensor(s) corresponding to the vehicle system component 101, and/or any other suitable criteria.

Referring to FIGS. 1 and 7, an exemplary application of the aspects of the present disclosure in practice is provided. The vehicle system prognosis apparatus 150 and method 800 were implemented using data received from a modern signal processing unit (MSPU) of an Apache aircraft. The MSPU data included various accelerometer measurements and low-level numeric features (e.g., condition indicators) that are derived from the accelerometer measurements. The MSPU data was generated and recorded periodically by the aircraft under specific operating regimes. In this example, a single measurement consists of a vector containing a numeric value for each of the condition indicators. Also in this example, a single vehicle system component, such as a gearbox, was analyzed and the data set (e.g., the $X_t$, $X_A$, $X_f$ time series) were created for the gearbox. It is noted that one or more of the time series $X_t$, $X_A$, $X_f$ may also include condition indicator data from other, e.g. related, vehicle system components so that relationships between the components may be determined by the Analysis model to produce a stronger/higher probability remaining useful life estimate. In this example, the time series of training condition indicator values $X_t$ was created by randomly selecting data points from a database of log entries with the requirement that the data points used in the time series of training condition indicator values $X_t$ were not associated with an impending failure. Then, a known time series of failure condition indicator values $X_f$ was compiled with respect to the gearbox.

The Gaussian model virtual sensor GMVS, when applied to the time series of failure condition indicator values $X_f$, was able to clearly show a signal as the impending failure approaches. For example, an anomaly surface 600 similar to that illustrated in FIG. 6 was generated from compiling the output signals of the Gaussian model virtual sensor GMVS from a small number of the time series of failure condition indicator values $X_f$. As can be seen in FIG. 6, the Gaussian model virtual sensor GMVS is not very sensitive to the specific value of the abnormal threshold, and the impending failure is noticeable even over 250 hours prior to the actual failure.

The failure query of Algorithm 5 was used to evaluate the performance of the vehicle system prognosis apparatus 150 using a single sliding time window $w_t$ of a time series of analysis condition indicator values $X_A$ and a target time $t_q$. In this case, the target time was 24 hours so that a prediction was made as to whether a failure would occur in less than 24 hours. A small parameter sweep was performed over different abnormal thresholds and each abnormal threshold was evaluated using leave one out cross validation. It was verified that the RUL model 146 (FIGS. 1 and 2) would flag the abnormal thresholds as being between the functions $l_{o+}$ and $l_{o-}$. FIG. 7 illustrates the results of one of the validations, showing that the aspects of the present disclosure may accurately identify a point that is within 24 hours of failure. The graph of FIG. 7 illustrates substantially every testing data point was captured by the RUL model 146 (FIGS. 1 and 2) when the abnormal threshold was about 2.5.

As can be seen above, the aspects of the present disclosure are demonstrated to identify impending vehicle system 100S (FIG. 1) and/or vehicle system component 101 (FIG. 1) failures and to provide a prediction of the remaining useful life of the vehicle system 100S and/or vehicle system component 101. The remaining useful life prediction made in accordance with the aspects of the present disclosure are simple to implement and the training and application of the models (e.g. the analysis model m and the RUL model 146 illustrated in FIG. 1) can be computed quickly so that the remaining useful life prediction is made in less than about 5 seconds (e.g. substantially in real time).

The disclosure and drawing figures describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or simultaneously. Additionally, in some aspects of the disclosure, not all operations described herein need be performed.

Examples of the disclosure may be described in the context of an aircraft manufacturing and service method 1000 as shown in FIG. 10 and a vehicle 902 as shown in FIG. 9. During pre-production, illustrative method 1000 may include specification and design 1004 of the vehicle 902 and material procurement 1006. During production, component and subassembly manufacturing 1008 and system integration 1010 of the vehicle 902 take place. Thereafter, the vehicle 902 may go through certification and delivery 1012 to be placed in service 1014. While in service by a customer, the vehicle 902 is scheduled for routine maintenance and service 1016 (which may also include modification, reconfiguration, refurbishment, and so on).

Each of the processes of the illustrative method 1000 may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

As shown in FIG. 9, the vehicle 902 produced by the illustrative method 1000 may include an airframe 918 with a plurality of high-level systems and an interior 922. Examples of high-level systems, which are distributed throughout the aircraft, include one or more of a propulsion system 924, an electrical power system 926, a hydraulic system 928, and an environmental system 930. Any number of other systems may be included. The vehicle system prognosis apparatus 150 and methods described herein may be integrated into at least any one or more of the aforementioned vehicle systems 924, 926, 928, 930 or any other systems of the vehicle 902. Although an aerospace example is shown, the principles of the invention may be applied to other industries, such as the automotive and maritime industries. Further, while the vehicle 902 is illustrated as a rotary wing aircraft in other aspects the aircraft may be a fixed wing aircraft, a space vehicle, maritime vehicle or any other suitable terrestrial or extraterrestrial vehicle.

The system and methods shown or described herein may be employed during any one or more of the stages of the manufacturing and service method 1000. For example, components or subassemblies corresponding to component and subassembly manufacturing 1008 may be fabricated or manufactured in a manner similar to components or subassemblies produced while the vehicle 902 is in service. Also, one or more aspects of the system, method, or combination thereof may be utilized during the production states 1008 and 1010, for example, by substantially expediting assembly of or reducing the cost of a vehicle 902. Similarly, one or more aspects of the system or method realizations, or a combination thereof, may be utilized, for example and without limitation, while the vehicle 902 is in service, e.g., operation, maintenance and service 1016.

The following are provided in accordance with the aspects of the present disclosure:

A1. A vehicle system prognosis apparatus comprising:
one or more sensors onboard a vehicle, the one or more sensors being configured to detect a predetermined characteristic of a vehicle system and generate at least one time series of condition indicator values corresponding to condition indicators for the predetermined characteristic; and
a processor coupled to the one or more sensors so that the processor receives the at least one time series of condition indicator values, the processor being configured to
generate an analysis model for the predetermined characteristic, the analysis model being trained by the processor with one or more of the at least one time series of condition indicator values, that are obtained from the one or more sensors with the vehicle system operating under normal conditions, extract from the at least one time series of condition indicator values, with the analysis model, one or more predetermined features embodying an indication of a health of the vehicle system, generate a quantified health assessment of the vehicle system by quantifying the one or more predetermined features based on a normal distribution of the one or more predetermined features from the analysis model, and communicate the quantified health assessment of the vehicle system to an operator or crew member of the vehicle.

A2. The vehicle system prognosis apparatus of paragraph A1, wherein the analysis model is a Gaussian model.

A3. The vehicle system prognosis apparatus of paragraph A1, wherein the processor is configured to extract the one or more predetermined features by applying a sliding time window of a predetermined size to the at least one time series of condition indicator values, where each data point of the at least one time series of condition indicator values within the sliding time window is scored with the analysis model to produce a point score for one or more data points within the sliding time window.

A4. The vehicle system prognosis apparatus of paragraph A3, wherein the one or more predetermined features comprises, for each sliding time window, a fraction of the point scores that exceed a predetermined threshold.

A5. The vehicle system prognosis apparatus of paragraph A3, wherein the one or more predetermined features comprises, for each sliding time window, a slope of a linear regression fitted to the point scores.

A6. The vehicle system prognosis apparatus of paragraph A3, wherein the one or more predetermined features comprises, for each sliding time window, a variance of the point scores.

A7. The vehicle system prognosis apparatus of paragraph A3, wherein the one or more predetermined features comprises, for each sliding time window, a mean of the point scores.

A8. The vehicle system prognosis apparatus of paragraph A3, wherein the processor is configured to form an ordered set of time windows by positioning of the sliding time window.

A9. The vehicle system prognosis apparatus of paragraph A1, wherein the processor is further configured to:

obtain at least one failure time series of condition indicator values, corresponding to the condition indicators, that are obtained from the one or more sensors with the vehicle system operating only under abnormal conditions; and extract predetermined failure features, from the at least one failure time series of condition indicator values by applying a sliding time window of a predetermined size to the at least one failure time series of condition indicator values, where each failure data point of the at least one failure time series of condition indicator values within the sliding time window is scored with the analysis model to produce a failure point score for one or more failure data points within the sliding time window;

wherein the predetermined failure features include a windowed version of the at least one failure time series of condition indicator values, a vector of failure point scores, and a vector of aggregated failure point scores.

A10. The vehicle system prognosis apparatus of paragraph A9, wherein the processor is configured to, for each sliding time window applied to the at least one time series of condition indicator values:

generate a collection of two-dimensional points that correspond to abnormal data points in the normal distribution of the one or more predetermined features, each of the two-dimensional points representing an aggregated score for a corresponding sliding time window versus an amount of time prior to failure that the corresponding sliding time window appeared; and fit curves to all of the two-dimensional points for all of the at least one time series of condition indicator values, where the curves define functions correspond to the mean, the mean plus a predetermined number of standard deviations and the mean minus the predetermined number of standard deviations of the two-dimensional points for all of the at least one time series of condition indicator values.

A11. The vehicle system prognosis apparatus of paragraph A10, wherein the processor is configured to apply the functions, defined by the curves, to the one or more predetermined features to generate the quantified health assessment of the vehicle system.

A12. The vehicle system prognosis apparatus of paragraph A1, wherein the quantified health assessment of the vehicle comprises a visualization of an anomaly (e.g., the presence of abnormal data among the data received during normal operation as determined by the normal distribution) surface, the anomaly surface being defined by a time before failure, an abnormality of the one or more predetermined features and the one or more predetermined features.

A13. The vehicle system prognosis apparatus of paragraph A1, wherein the quantified health assessment of the vehicle comprises a Boolean quantification.

A14. The vehicle system prognosis apparatus of paragraph A13, further comprising a user interface coupled to the processor, the processor being configured to receive an analysis time period from the user interface for generating the quantified health assessment.

A15. The vehicle system prognosis apparatus of paragraph A14, wherein the Boolean quantification is a Boolean indication of a remaining useful life of the vehicle system within the analysis time period.

A16. The vehicle system prognosis apparatus of paragraph A1, wherein the quantified health assessment of the vehicle system is an indication of a remaining useful life of the vehicle system.

B1. A vehicle system prognosis apparatus comprising:

one or more sensors onboard a vehicle, the one or more sensors being configured to detect a predetermined characteristic of a vehicle system and generate at least one time series of condition indicator values corresponding to condition indicators for the predetermined characteristic;

a user interface; and a processor coupled to both the one or more sensors and the user interface, the processor being configured to identify anomalies within the at least one time series of condition indicator values and communicate a quantified health assessment of the vehicle system, through the user interface, at least as a visual representation of an anomaly surface corresponding to the anomalies identified within the at least one time series of condition indicator values.

B2. The vehicle system prognosis apparatus of paragraph B1, wherein the anomaly surface is defined by a time before failure, an abnormality of one or more predetermined features and the one or more predetermined features, where the one or more predetermined features embody an indication of a health of the vehicle system.

B3. The vehicle system prognosis apparatus of paragraph B1, wherein the quantified health assessment of the vehicle further comprises a Boolean quantification.

B4. The vehicle system prognosis apparatus of paragraph B3, further comprising a user interface coupled to the processor, the processor being configured to receive an analysis time period from the user interface for generating the quantified health assessment.

B5. The vehicle system prognosis apparatus of paragraph B4, wherein the Boolean quantification is a Boolean indication of remaining useful life of the vehicle system within the analysis time period.

B6. The vehicle system prognosis apparatus of paragraph B1, wherein the processor is configured to:

generate an analysis model for the predetermined characteristic, the analysis model being trained by the processor with one or more of the at least one time series of condition indicator values, corresponding to the condition indicators, that are obtained from the one or more sensors with the vehicle system operating under normal conditions, extract from the at least one time series of condition indicator values, with the analysis model, one or more predetermined features embodying an indication of a health of the vehicle system, and generate a quantified health assessment of the vehicle system by quantifying the one or more predetermined features based on a normal distribution of the one or more predetermined features.

B7. The vehicle system prognosis apparatus of paragraph B6, wherein the analysis model is a Gaussian model.

B8. The vehicle system prognosis apparatus of paragraph B6, wherein the processor is configured to extract the one or more predetermined features by applying a sliding time window of a predetermined size to the at least one time series of condition indicator values, where each data point of the at least one time series of condition indicator values within the sliding time window is scored with the analysis model to produce a point score for one or more data points within the sliding time window.

B9. The vehicle system prognosis apparatus of paragraph B8, wherein the one or more predetermined features comprises, for each sliding time window, a fraction of the point scores that exceed a predetermined threshold.

B10. The vehicle system prognosis apparatus of paragraph B8, wherein the one or more predetermined features comprises, for each sliding time window, a slope of a linear regression fitted to the point scores.

B11. The vehicle system prognosis apparatus of paragraph B8, wherein the one or more predetermined features comprises, for each sliding time window, a variance of the point scores.

B12. The vehicle system prognosis apparatus of paragraph B8, wherein the one or more predetermined features comprises, for each sliding time window, a mean of the point scores.

B13. The vehicle system prognosis apparatus of paragraph B8, wherein the processor is configured to form an ordered set of time windows by positioning of the sliding time window.

B14. The vehicle system prognosis apparatus of paragraph B6, wherein the processor is further configured to:

obtain at least one failure time series of condition indicator values, corresponding to the condition indicators, that are obtained from the one or more sensors with the vehicle system operating only under abnormal conditions; and extract predetermined failure features, from the at least one failure time series of condition indicator values by applying a sliding time window of a predetermined size to the at least one failure time series of condition indicator values, where each failure data point of the at least one failure time series of condition indicator values within the sliding time window is scored with the analysis model to produce a failure point score for one or more failure data points within the sliding time window;

wherein the predetermined failure features include a windowed version of the at least one failure time series, a vector of failure point scores, and a vector of aggregated failure point scores.

B15. The vehicle system prognosis apparatus of paragraph B14, wherein the processor is configured to, for each sliding time window applied to the at least one time series of condition indicator values:

generate a collection of two-dimensional points that correspond to abnormal data points in the normal distribution of the one or more predetermined features, each of the two-dimensional points representing an aggregated score for a corresponding sliding time window versus an amount of time prior to failure that the corresponding sliding time window appeared; and fit curves to all of the two-dimensional points for all of the at least one time series of condition indicator values, where the curves define functions correspond to the mean, the mean plus a predetermined number of standard deviations and the mean minus the predetermined number of standard deviations of the two-dimensional points for all of the at least one time series of condition indicator values.

B16. The vehicle system prognosis apparatus of paragraph B15, wherein the processor is configured to apply the functions, defined by the curves, to the one or more predetermined features to generate the quantified health assessment of the vehicle system.

B17. The vehicle system prognosis apparatus of paragraph B1, wherein the quantified health assessment of the vehicle system is an indication of a remaining useful life of the vehicle system.

C1. A method for vehicle system prognosis, the method comprising:

detecting, with one or more sensors onboard a vehicle, a predetermined characteristic of a vehicle system and generating at least one time series of condition indicator values $(X_t, X_A)$ corresponding to condition indicators for the predetermined characteristic; and receiving the at least one time series of condition indicator values with a processor, and with the processor generating an analysis model for the predetermined characteristic, the analysis model being trained by the processor with one or more of the at least one time series of condition indicator values $(X_t)$, corresponding to the condition indicators, that are obtained from the one or more sensors with the vehicle system operating under normal conditions;

extracting from the at least one time series of condition indicator values $(X_A)$, with the analysis model, one or more predetermined features embodying an indication of a health of the vehicle system, generating a quantified health assessment of the vehicle system by quantifying the one or more predetermined features based on a normal distribution of the one or more predetermined features, and communicating the quantified health assessment of the vehicle system to an operator or crew member of the vehicle.

C2. The method of paragraph C1, wherein the analysis model is a Gaussian model.

C3. The method of paragraph C1, wherein the one or more predetermined features are extracted by applying a sliding time window of a predetermined size to the at least one time series of condition indicator values, where each data point of the at least one time series of condition indicator values within the sliding time window is scored with the analysis model to produce a point score for one or more data points within the sliding time window.

C4. The method of paragraph C3, wherein the one or more predetermined features comprises, for each sliding time window, a fraction of the point scores that exceed a predetermined threshold.

C5. The method of paragraph C3, wherein the one or more predetermined features comprises, for each sliding time window, a slope of a linear regression fitted to the point scores.

C6. The method of paragraph C3, wherein the one or more predetermined features comprises, for each sliding time window, a variance of the point scores.

C7. The method of paragraph C3, wherein the one or more predetermined features comprises, for each sliding time window, a mean of the point scores.

C8. The method of paragraph C3, further comprising forming, with the processor, an ordered set of time windows by positioning of the sliding time window.

C9. The method of paragraph C1, further comprising, with the processor:
obtaining at least one failure time series of condition indicator values, corresponding to the condition indicators, that are obtained from the one or more sensors with the vehicle system operating only under abnormal conditions; and
extracting predetermined failure features, from the at least one failure time series of condition indicator values by applying a sliding time window of a predetermined size to the at least one failure time series of condition indicator values, where each failure data point of the at least one failure time series of condition indicator values within the sliding time window is scored with the analysis model to produce a failure point score for one or more failure data points within the sliding time window;
wherein the predetermined failure features include a windowed version of the at least one failure time series of condition indicator values, a vector of failure point scores, and a vector of aggregated failure point scores.

C10. The method of paragraph C9, further comprising, for each sliding time window applied to the at least one time series of condition indicator values:
generating, with the processor, a collection of two-dimensional points that correspond to abnormal data points in the normal distribution of the one or more predetermined features, each of the two-dimensional points representing an aggregated score for a corresponding sliding time window versus an amount of time prior to failure that the corresponding sliding time window appeared; and
fitting curves to all of the two-dimensional points for all of the at least one time series of condition indicator values with the processor, where the curves define functions correspond to the mean, the mean plus a predetermined number of standard deviations and the mean minus a predetermined number of standard deviations of the two-dimensional points for all of the at least one time series of condition indicator values.

C11. The method of paragraph C10, further comprising, applying the functions, defined by the curves, to the one or more predetermined features with the processor to generate the quantified health assessment of the vehicle system.

C12. The method of paragraph C1, wherein the quantified health assessment of the vehicle comprises a visualization of an anomaly surface, the anomaly surface being defined by a time before failure, an abnormality of the one or more predetermined features and the one or more predetermined features.

C13. The method of paragraph C1, wherein the quantified health assessment of the vehicle comprises a Boolean quantification.

C14. The method of paragraph C13, further comprising receiving, with the processor, an analysis time period from the user interface for generating the quantified health assessment.

C15. The method of paragraph C14, wherein the Boolean quantification is a Boolean indication of a remaining useful life of the vehicle system within the analysis time period.

In the figures, referred to above, solid lines, if any, connecting various elements and/or components may represent mechanical, electrical, fluid, optical, electromagnetic, wireless and other couplings and/or combinations thereof. As used herein, "coupled" means associated directly as well as indirectly. For example, a member A may be directly associated with a member B, or may be indirectly associated therewith, e.g., via another member C. It will be understood that not all relationships among the various disclosed elements are necessarily represented. Accordingly, couplings other than those depicted in the drawings may also exist. Dashed lines, if any, connecting blocks designating the various elements and/or components represent couplings similar in function and purpose to those represented by solid lines; however, couplings represented by the dashed lines may either be selectively provided or may relate to alternative examples of the present disclosure. Likewise, elements and/or components, if any, represented with dashed lines, indicate alternative examples of the present disclosure. One or more elements shown in solid and/or dashed lines may be omitted from a particular example without departing from the scope of the present disclosure. Environmental elements, if any, are represented with dotted lines. Virtual (imaginary) elements may also be shown for clarity. Those skilled in the art will appreciate that some of the features illustrated in the figures, may be combined in various ways without the need to include other features described in the figures, other drawing figures, and/or the accompanying disclosure, even though such combination or combinations are not explicitly illustrated herein. Similarly, additional features not limited to the examples presented, may be combined with some or all of the features shown and described herein.

In FIGS. 8 and 10, referred to above, the blocks may represent operations and/or portions thereof and lines connecting the various blocks do not imply any particular order or dependency of the operations or portions thereof. Blocks represented by dashed lines indicate alternative operations and/or portions thereof. Dashed lines, if any, connecting the various blocks represent alternative dependencies of the operations or portions thereof. It will be understood that not all dependencies among the various disclosed operations are necessarily represented. FIGS. 8 and 10 and the accompanying disclosure describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or simultaneously. Additionally, those skilled in the art will appreciate that not all operations described need be performed.

In the foregoing description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

Different examples of the apparatus(es) and method(s) disclosed herein include a variety of components, features, and functionalities. It should be understood that the various examples of the apparatus(es) and method(s) disclosed herein may include any of the components, features, and functionalities of any of the other examples of the apparatus(es) and method(s) disclosed herein in any combination, and all of such possibilities are intended to be within the scope of the present disclosure.

Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims, if any, are presented for illustrative purposes only and are not intended to limit the scope of the claimed subject matter to the specific examples provided in the present disclosure.

What is claimed is:

1. A vehicle system prognosis apparatus comprising:
   one or more sensors onboard a vehicle, the one or more sensors being configured to detect a predetermined characteristic of a vehicle system and generate at least one time series of condition indicator values corresponding to condition indicators for the predetermined characteristic; and
   a processor coupled to the one or more sensors so that the processor receives the at least one time series of condition indicator values, the processor being configured to
      generate an analysis model for the predetermined characteristic, the analysis model being trained by the processor with one or more of the at least one time series of condition indicator values, that are obtained from the one or more sensors with the vehicle system operating under normal conditions,
      extract from the at least one time series of condition indicator values, with the analysis model, one or more predetermined features embodying an indication of a health of the vehicle system,
      generate a quantified health assessment of the vehicle system by quantifying the one or more predetermined features based on a normal distribution of the one or more predetermined features from the analysis model,
      communicate the quantified health assessment of the vehicle system to an operator or crew member of the vehicle, and extract the one or more predetermined features by applying a sliding time window of a predetermined size to the at least one time series of condition indicator values, where each data point of the at least one time series of condition indicator values within the sliding time window is scored with the analysis model to produce a point score for one or more data points within the sliding time window.

2. The vehicle system prognosis apparatus of claim 1, wherein the analysis model is a Gaussian model.

3. The vehicle system prognosis apparatus of claim 1, wherein the processor is further configured to:
   obtain at least one failure time series of condition indicator values, corresponding to the condition indicators, that are obtained from the one or more sensors with the vehicle system operating only under abnormal conditions; and
   extract predetermined failure features, from the at least one failure time series of condition indicator values by applying a sliding time window of a predetermined size to the at least one failure time series of condition indicator values, where each failure data point of the at least one failure time series of condition indicator values within the sliding time window is scored with the analysis model to produce a failure point score for one or more failure data points within the sliding time window;
   wherein the predetermined failure features include a windowed version of the at least one failure time series of condition indicator values, a vector of failure point scores, and a vector of aggregated failure point scores.

4. The vehicle system prognosis apparatus of claim 3, wherein the processor is configured to, for each sliding time window applied to the at least one time series of condition indicator values:

generate a collection of two-dimensional points that correspond to abnormal data points in the normal distribution of the one or more predetermined features, each of the two-dimensional points representing an aggregated score for a corresponding sliding time window versus an amount of time prior to failure that the corresponding sliding time window appeared; and fit curves to all of the two-dimensional points for all of the at least one time series of condition indicator values, where the curves define functions correspond to the mean, the mean plus a predetermined number of standard deviations and the mean minus the predetermined number of standard deviations of the two-dimensional points for all of the at least one time series of condition indicator values.

5. The vehicle system prognosis apparatus of claim 4, wherein the processor is configured to apply the functions, defined by the curves, to the one or more predetermined features to generate the quantified health assessment of the vehicle system.

6. The vehicle system prognosis apparatus of claim 1, wherein the quantified health assessment of the vehicle comprises a visualization of an anomaly surface, the anomaly surface being defined by a time before failure, an abnormality of the one or more predetermined features, and the one or more predetermined features.

7. The vehicle system prognosis apparatus of claim 1, wherein the quantified health assessment of the vehicle comprises a Boolean quantification.

8. The vehicle system prognosis apparatus of claim 7, further comprising a user interface coupled to the processor, the processor being configured to receive an analysis time period from the user interface for generating the quantified health assessment.

9. The vehicle system prognosis apparatus of claim 8, wherein the Boolean quantification is a Boolean indication of a remaining useful life of the vehicle system within the analysis time period.

10. The vehicle system prognosis apparatus of claim 1, wherein the quantified health assessment of the vehicle system is an indication of a remaining useful life of the vehicle system.

11. A vehicle system prognosis apparatus comprising:
one or more sensors onboard a vehicle, the one or more sensors being configured to detect a predetermined characteristic of a vehicle system and generate at least one time series of condition indicator values corresponding to condition indicators for the predetermined characteristic;
a user interface; and
a processor coupled to both the one or more sensors and the user interface, the processor being configured to:
obtain at least one failure time series of condition indicator values, corresponding to the condition indicators, that are obtained from the one or more sensors with the vehicle system operating only under abnormal conditions;
extract predetermined failure features, from the at least one failure time series of condition indicator values by applying a sliding time window of a predetermined size to the at least one failure time series of condition indicator values, where each failure data point of the at least one failure time series of condition indicator values within the sliding time window is scored with an analysis model to produce a failure point score for one or more failure data points within the sliding time window, wherein the predetermined failure features include a windowed version of the at least one failure time series of condition indicator values, a vector of failure point scores, and a vector of aggregated failure point scores; and identify anomalies within the at least one time series of condition indicator values and communicate a quantified health assessment of the vehicle system, through the user interface, at least as a visual representation of a three-dimensional anomaly surface corresponding to the anomalies identified within the at least one time series of condition indicator values.

12. The vehicle system prognosis apparatus of claim 11, wherein the anomaly surface is defined by a time before failure, an abnormality of one or more predetermined features, and the one or more predetermined features, where the one or more predetermined features embody an indication of a health of the vehicle system.

13. The vehicle system prognosis apparatus of claim 11, wherein the processor is configured to:
generate the analysis model for the predetermined characteristic, the analysis model being trained by the processor with one or more of the at least one time series of condition indicator values, corresponding to the condition indicators, that are obtained from the one or more sensors with the vehicle system operating under normal conditions,
extract from the at least one time series of condition indicator values, with the analysis model, one or more predetermined features embodying an indication of a health of the vehicle system, and
generate a quantified health assessment of the vehicle system by quantifying the one or more predetermined features based on a normal distribution of the one or more predetermined features.

14. The vehicle system prognosis apparatus of claim 13, wherein the analysis model is a Gaussian model.

15. A method for vehicle system prognosis, the method comprising:
detecting, with one or more sensors onboard a vehicle, a predetermined characteristic of a vehicle system and generating at least one time series of condition indicator values corresponding to condition indicators for the predetermined characteristic; and
receiving the at least one time series of condition indicator values with a processor, and with the processor
generating an analysis model for the predetermined characteristic, the analysis model being trained by the processor with one or more of the at least one time series of condition indicator values, corresponding to the condition indicators, that are obtained from the one or more sensors with the vehicle system operating under normal conditions;
extracting from the at least one time series of condition indicator values, with the analysis model, one or more predetermined features embodying an indication of a health of the vehicle system,
generating a quantified health assessment of the vehicle system by quantifying the one or more predetermined features based on a normal distribution of the one or more predetermined features, and
communicating the quantified health assessment of the vehicle system to an operator or crew member of the vehicle;
wherein the one or more predetermined features are extracted by applying a sliding time window of a predetermined size to the at least one time series of condition indicator values, where each data point of the at least one time series of condition indicator values within the sliding time window is scored with the analysis model to produce a point score for one or more data points within the sliding time window.

16. The method of claim 15, further comprising, with the processor:
obtaining at least one failure time series of condition indicator values, corresponding to the condition indicators, that are obtained from the one or more sensors with the vehicle system operating only under abnormal conditions; and
extracting predetermined failure features, from the at least one failure time series of condition indicator values by applying a sliding time window of a predetermined size to the at least one failure time series of condition indicator values, where each failure data point of the at least one failure time series of condition indicator values within the sliding time window is scored with the analysis model to produce a failure point score for one or more failure data points within the sliding time window;
wherein the predetermined failure features include a windowed version of the at least one failure time series of condition indicator values, a vector of failure point scores, and a vector of aggregated failure point scores.

17. The method of claim 16, further comprising, for each sliding time window applied to the at least one time series of condition indicator values:
generating, with the processor, a collection of two-dimensional points that correspond to abnormal data points in the normal distribution of the one or more predetermined features, each of the two-dimensional points representing an aggregated score for a corresponding sliding time window versus an amount of time prior to failure that the corresponding sliding time window appeared; and
fitting curves to all of the two-dimensional points for all of the at least one time series of condition indicator values with the processor, where the curves define functions correspond to the mean, the mean plus a predetermined number of standard deviations and the mean minus a predetermined number of standard deviations of the two-dimensional points for all of the at least one time series of condition indicator values.

18. The vehicle system prognosis apparatus of claim 1, wherein the one or more predetermined features comprises, for each sliding time window, a fraction of the point scores that exceed a predetermined threshold, a slope of a linear regression fitted to the point scores, a variance of the point scores, or a mean of the point scores.

19. The method of claim 15, wherein the one or more predetermined features comprises, for each sliding time window, a fraction of the point scores that exceed a predetermined threshold, a slope of a linear regression fitted to the point scores, a variance of the point scores, or a mean of the point scores.

20. The vehicle system prognosis apparatus of claim 11, wherein the quantified health assessment of the vehicle system is an indication of a remaining useful life of the vehicle system.

* * * * *